United States Patent
Jang et al.

(10) Patent No.: US 8,515,001 B2
(45) Date of Patent: Aug. 20, 2013

(54) SHIFT REGISTER

(75) Inventors: Yong-Ho Jang, Goyang-si (KR); Seung-Chan Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/333,465

(22) Filed: Dec. 21, 2011

(65) Prior Publication Data

US 2012/0163528 A1   Jun. 28, 2012

(30) Foreign Application Priority Data

Dec. 24, 2010 (KR) .................. 10-2010-0134274

(51) Int. Cl.
*G11C 19/00* (2006.01)

(52) U.S. Cl.
USPC .................. 377/64; 377/78; 377/79

(58) Field of Classification Search
None
See application file for complete search history.

(56) References Cited

U.S. PATENT DOCUMENTS

| | | | | |
|---|---|---|---|---|
| 6,970,530 B1 * | 11/2005 | Wang et al. | ...................... | 377/69 |
| 7,436,923 B2 * | 10/2008 | Tobita | .............................. | 377/64 |
| 7,529,333 B2 * | 5/2009 | Kim et al. | ....................... | 377/64 |
| 8,208,598 B2 * | 6/2012 | Tsai et al. | ........................ | 377/64 |
| 8,253,680 B2 * | 8/2012 | Jang et al. | ...................... | 345/100 |
| 8,350,563 B2 * | 1/2013 | Haas et al. | ..................... | 324/225 |
| 2006/0291610 A1 * | 12/2006 | Lo et al. | ........................... | 377/64 |
| 2007/0001991 A1 * | 1/2007 | Jang et al. | ...................... | 345/100 |
| 2007/0297559 A1 * | 12/2007 | Cho et al. | ........................ | 377/64 |
| 2008/0101529 A1 * | 5/2008 | Tobita | .............................. | 377/64 |
| 2009/0167668 A1 * | 7/2009 | Kim | ............................... | 345/100 |
| 2010/0150301 A1 * | 6/2010 | Chan et al. | ..................... | 377/64 |
| 2010/0214279 A1 * | 8/2010 | Kim et al. | ...................... | 345/213 |
| 2011/0280362 A1 * | 11/2011 | Jang | .................................. | 377/64 |
| 2012/0044132 A1 * | 2/2012 | Koga et al. | ..................... | 345/100 |

* cited by examiner

*Primary Examiner* — Tuan T Lam

(74) *Attorney, Agent, or Firm* — Brinks Hofer Gilson & Lione

(57) ABSTRACT

Disclosed herein is a shift register in which leakage of charges from a voltage at a set node is prevented to stabilize an output from a stage. The shift register includes a plurality of stages for sequentially outputting scan pulses. Each stage includes a node controller for controlling signal states of a set node and a reset node, and an output unit supplied with any one of a plurality of clock pulses having different phases. The output unit outputs the supplied clock pulse as a scan pulse through an output terminal thereof according to the signal states of the set node and reset node. The node controller includes a first discharging switching device which is turned on or off in response to a scan pulse from a downstream stage. The first discharging switching device is connected between any one of a plurality of clock transfer lines and the set node.

3 Claims, 38 Drawing Sheets

SHIFT REGISTER

This application claims the priority and the benefit under 35 U.S.C. §119(a) on Patent Application No. 10-2010-0134274 filed in Republic of Korea on Nov. 24, 2010, the entire contents of which are hereby incorporated by reference.

BACKGROUND

1. Field of the Invention

The present disclosure relates to a shift register, and more particularly, to a shift register in which leakage of charges from a voltage at a set node is prevented to stabilize an output from a stage.

2. Discussion of the Related Art

A shift register outputs a plurality of scan pulses in order to sequentially drive gate lines of a display device, such as a liquid crystal display. To this end, the shift register includes a plurality of switching devices therein. An oxide semiconductor transistor may be employed as such a switching device.

FIG. 1 is a view illustrating relational characteristics between gate voltage and drain current of a conventional oxide semiconductor transistor based on temperature.

For an N-type oxide semiconductor transistor used in a shift register, it is preferable that a threshold voltage thereof have a positive value. However, as temperature increases, the threshold voltage of the oxide semiconductor transistor moves negatively, as shown in FIG. 1. For this reason, the N-type oxide semiconductor transistor, which has to be turned off in an output period of the shift register, may not be normally turned off at a high temperature, thereby generating leakage current. This leakage current may lower a voltage at a set node, resulting in a problem that the output of the shift register is not normally generated.

FIG. 2 is a view illustrating a voltage at a set node and a voltage of a scan pulse based on a variation in a threshold voltage of a conventional oxide semiconductor transistor.

As can be seen from FIG. 2(a), when the threshold voltage of the oxide semiconductor transistor is −1, the voltage at the set node rapidly falls due to leakage current of the oxide semiconductor transistor, so that the voltage of the scan pulse, which is an output of a shift register, rapidly falls too.

Also, as can be seen from FIG. 2(b), when the threshold voltage of the oxide semiconductor transistor is −3, the leakage current of the oxide semiconductor transistor increases still further, so that the voltage at the set node cannot even rise, thereby causing the scan pulse not to be generated at all.

BRIEF SUMMARY

A shift register includes a plurality of stages for sequentially outputting scan pulses, wherein each of the stages includes a node controller for controlling signal states of a set node and a reset node, and an output unit supplied with any one of a plurality of clock pulses having different phases, the output unit outputting the supplied clock pulse as a corresponding one of the scan pulses through an output terminal thereof according to the signal states of the set node and reset node, wherein the node controller of each stage includes a first discharging switching device turned on or off in response to a scan pulse from a downstream one of the stages, the first discharging switching device being connected between any one of a plurality of clock transfer lines, the clock transfer lines transferring the clock pulses, respectively, and the set node.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
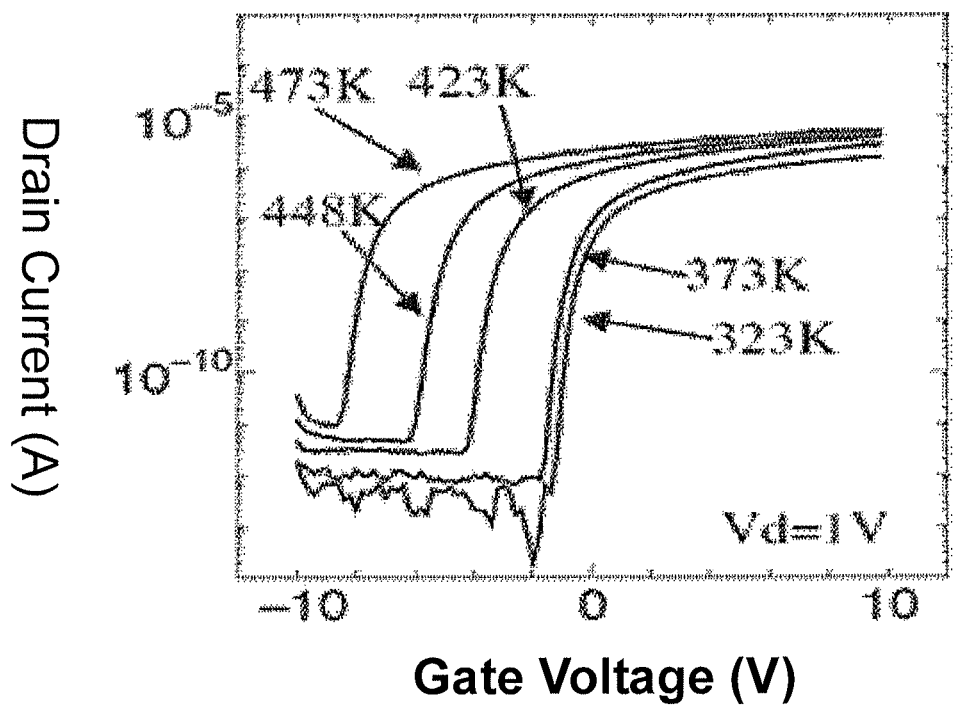
FIG. 1 is a view illustrating relational characteristics between a gate voltage and drain current of a conventional oxide semiconductor transistor based on temperature.
Figure 2:
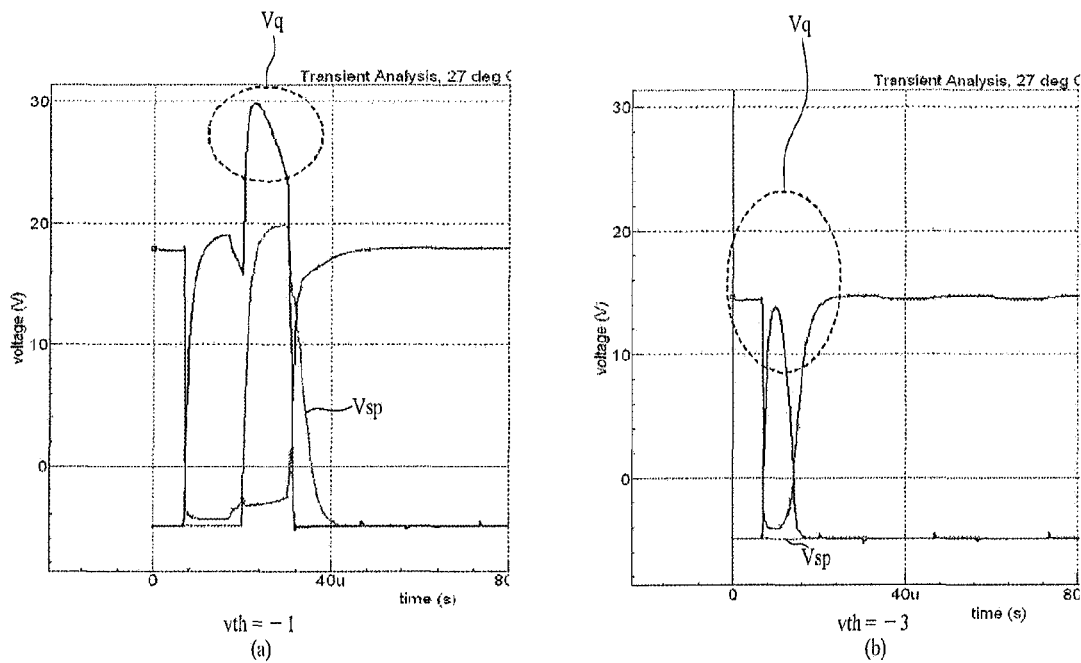
FIG. 2 is a view illustrating a voltage at a set node and a voltage of a scan pulse based on a variation in a threshold voltage of a conventional oxide semiconductor transistor.
Figure 3:
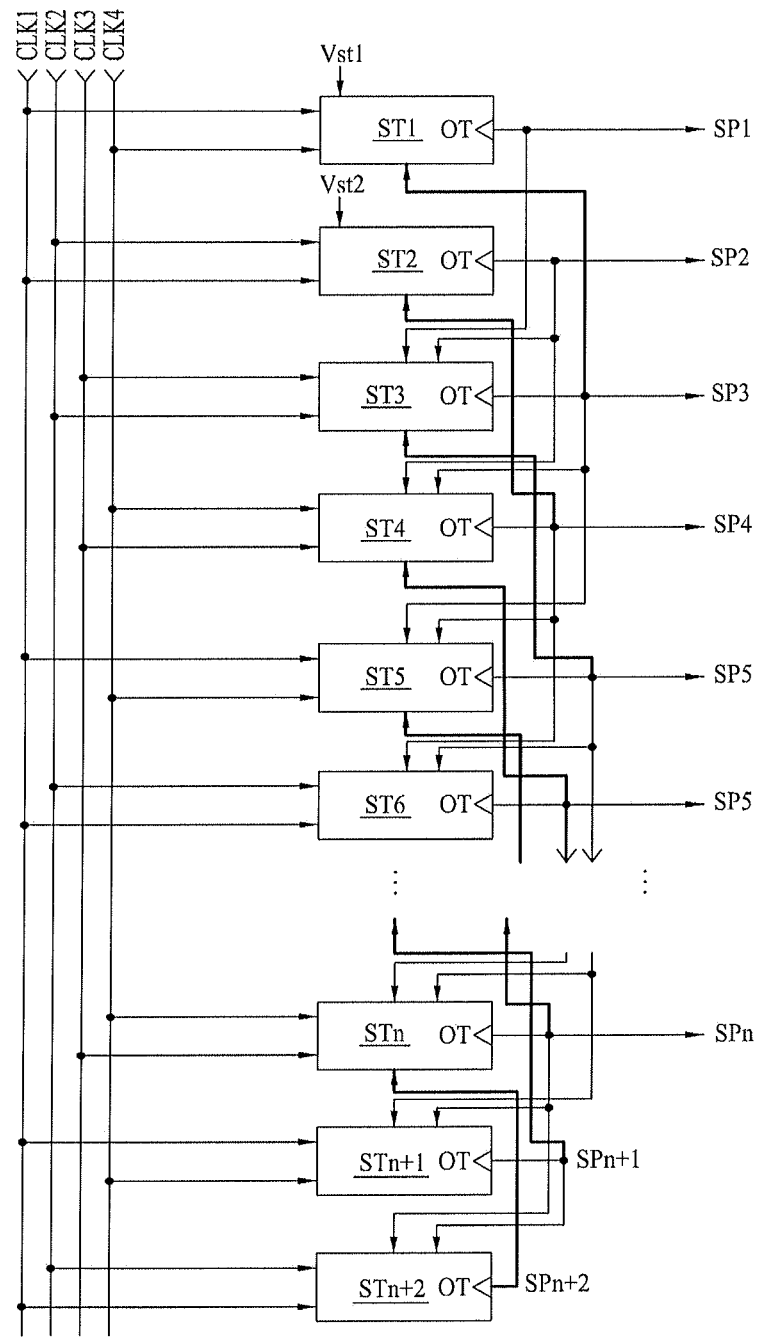
FIG. 3 is a block diagram showing the configuration of a shift register according to an embodiment of the present invention.
Figure 4:
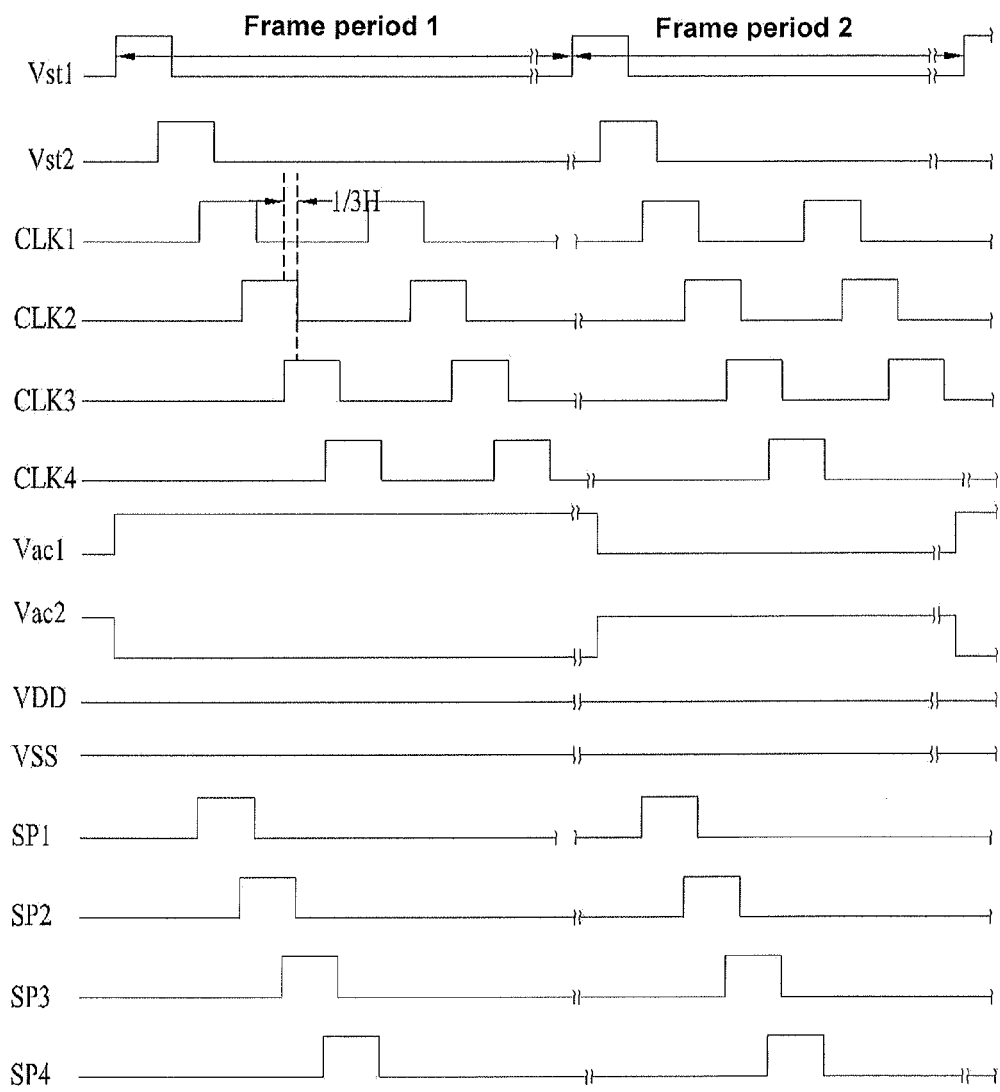
FIG. 4 is a timing diagram of various signals which are supplied to the shift register of FIG. 3 and various signals which are output therefrom.

FIG. 3 is a block diagram showing the configuration of a shift register according to an embodiment of the present invention, and FIG. 4 is a timing diagram of various signals which are supplied to the shift register of FIG. 3 and various signals which are output therefrom.

The shift register according to the present embodiment includes n stages ST1 to STn and two dummy stages STn+1 and STn+2, as shown in FIG. 3. Each of the stages ST1 to STn+2 outputs one scan pulse SP1 to SPn+2 for one frame period through an output terminal OT thereof.

Each of the stages ST1 to STn drives a gate line connected thereto using the scan pulse. Also, each of all the stages ST1 to STn+2 including the first and second dummy stages controls the operations of a stage downstream therefrom and a stage upstream therefrom using the scan pulse.

The stages ST1 to STn+2 output the scan pulses in order from the first stage ST1 to the second dummy stage STn+2. That is, the first stage ST1 outputs the first scan pulse SP1, the second stage ST2 then outputs the second scan pulse SP2, the third stage ST3 then outputs the third scan pulse SP3, ..., the nth stage STn then outputs the nth scan pulse SPn, and the first dummy stage STn+1 then outputs the (n+1)th scan pulse SPn+1. Finally, the second dummy stage STn+2 outputs the (n+2)th scan pulse SPn+2.

The scan pulses output from the stages ST1 to STn, other than the first and second dummy stages STn+1 and STn+2, are sequentially supplied to gate lines of a liquid crystal panel (not shown) to sequentially scan the gate lines. Also, the scan pulse output from each of the stages is supplied only to an upstream stage, is supplied to the upstream stage and a downstream stage or is supplied only to the downstream stage.

This shift register may be built in the liquid crystal panel. That is, the liquid crystal panel has a display region for displaying an image, and a non-display region surrounding the display region, and the shift register is built in the non-display region.

Each of all the stages ST1 to STn+2 of the shift register, configured in this manner, is supplied with a charging voltage VDD, a discharging voltage VSS, and at least one of first to fourth clock pulses CLK1 to CLK4 which are output sequentially out of phase with one another and cyclically. On the other hand, the first stage ST1, second stage ST2, first dummy stage STn+1 and second dummy stage STn+2 among the stages ST1 to STn+2 are further supplied with first and second start pulses Vst1 and Vst2.

The charging voltage VDD is mainly used to charge nodes of each stage ST1 to STn+2, and the discharging voltage VSS is mainly used to discharge the nodes and output terminal OT of each stage ST1 to STn+2.

Both the charging voltage VDD and discharging voltage VSS are direct current (DC) voltages. The charging voltage VDD is positive and the discharging voltage VSS is negative. Here, the discharging voltage VSS may be a ground voltage.

On the other hand, each of the stages may be further supplied with first and second alternating current (AC) voltages Vac1 and Vac2 according to a circuit configuration thereof.

The first and second AC voltages Vac1 and Vac2 are AC signals that are mainly used for control of charging and discharging of reset nodes among the nodes of each stage ST1 to STn+2. The first AC voltage Vac1 is 180° phase-inverted with respect to the second AC voltage Vac2. The high-state voltage value of each of the first and second AC voltages Vac1 and Vac2 may be the same as the voltage value of the charging voltage VDD, and the low-state voltage value of each of the first and second AC voltages Vac1 and Vac2 may be the same as the voltage value of the discharging voltage VSS. The states of the first and second AC voltages Vac1 and Vac2 are inverted at intervals of a period of p frames. Here, p is a natural number.

The first to fourth clock pulses CLK1 to CLK4 are signals which are used to generate the scan pulses SP1 to SPn+2 of the respective stages ST1 to STn+2. Each stage ST1 to STn+2 receives any one of the first to fourth clock pulses CLK1 to CLK4 and outputs a corresponding one of the scan pulses SP1 to SPn+2. For example, a (4j+1)th stage may output a corresponding scan pulse using the first clock pulse CLK1, a (4j+2)th stage may output a corresponding scan pulse using the second clock pulse CLK2, a (4j+3)th stage may output a corresponding scan pulse using the third clock pulse CLK3, and a (4j+4)th stage may output a corresponding scan pulse using the fourth clock pulse CLK4. Here, j is a natural number.

Although the four types of clock pulses having different phases are used for illustrative purposes in the present invention, any number of types of clock pulses may be used as long as they are two or more.

As shown in FIG. 4, the clock pulses CLK1 to CLK4 are output in such a manner that high durations of clock pulses output in adjacent periods overlap with each other for a certain period. For example, the first clock pulse CLK1 and second clock pulse CLK2 adjacent to each other may be output in such a manner that high durations thereof overlap with each other for a time corresponding to about ½H (horizontal period). Alternatively, the overlap time may be ⅓H. As the high durations of the adjacent clock pulses overlap with each other in this manner, the scan pulses have the same characteristics as those of the clock pulses, too. That is, as shown in FIG. 4, the scan pulses are output in such a manner that high durations of scan pulses output in adjacent periods overlap with each other for a certain period. The first and second start pulses Vst1 and Vst2 may also overlap with each other.

As shown in FIG. 3, a kth stage is enabled in response to scan pulses from (k−2)th and (k−1)th stages. Here, k is a natural number. Exceptionally, the first stage ST1 is enabled in response to the first start pulse Vst1 from a timing controller (not shown), and the second stage ST2 is enabled in response to the second start pulse Vst2 from the timing controller. Alternatively, the second stage ST2 may be enabled by the first start pulse Vst1 instead of the second start pulse Vst2.

The kth stage is disabled in response to a scan pulse from a (k+2)th stage. Exceptionally, the first and second dummy stages STn+1 and STn+2 are disabled in response to the first start pulse Vst1 or second start pulse Vst2 from the timing controller.

Hereinafter, a circuit configuration of each stage will be described in detail.

Shift Register According to First Embodiment

Figure 5:
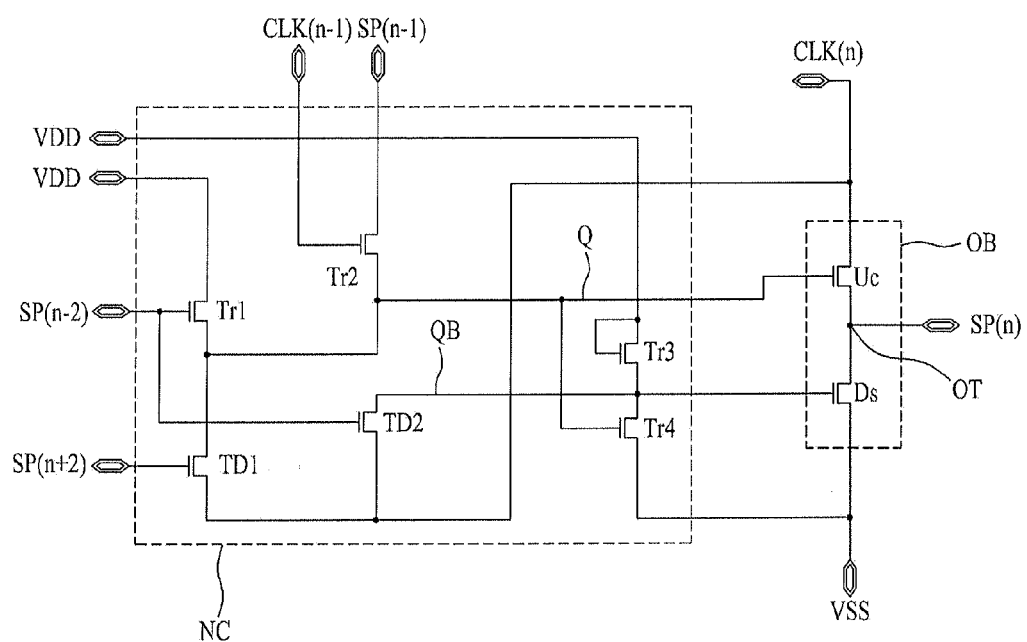
FIG. 5 is a circuit diagram of a stage according to a first embodiment of the present invention.

FIG. 5 is a circuit diagram of a stage according to a first embodiment of the present invention.

Each stage according to the first embodiment of the present invention includes a node controller NC and an output unit OB, as shown in FIG. 5. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof according to the signal states of the set node Q and reset node QB.

The node controller NC of the nth stage includes the set node Q, the reset node QB, first and second discharging switching devices TD1 and TD2, and first to fourth switching devices Tr1 to Tr4.

The first discharging switching device TD1 of the nth stage is turned on or off in response to the scan pulse from the (n+2)th stage, and electrically interconnects the set node Q and any one of a plurality of clock transfer lines, which transfer the clock pulses, respectively, when turned on. Exceptionally, the first discharging switching device TD1 of the first dummy stage STn+1 is controlled by the first start pulse Vst1 from the timing controller instead of the scan pulse from the (n+2)th stage. Similarly, the first discharging switching device TD1 of the second dummy stage STn+2 is controlled by the second start pulse Vst2 from the timing controller instead of the scan pulse from the (n+2)th stage.

The second discharging switching device TD2 of the nth stage is turned on or off in response to the scan pulse from the (n−2)th stage, and electrically interconnects the reset node QB and the clock transfer line when turned on. Exceptionally, the second discharging switching device TD2 of the first stage ST1 is controlled by the first start pulse Vst1 from the timing controller instead of the scan pulse from the (n−2)th stage. Similarly, the second discharging switching device TD2 of the second stage ST2 is controlled by the second start pulse Vst2 from the timing controller instead of the scan pulse from the (n−2)th stage.

The first switching device Tr1 of the nth stage is turned on or off in response to the scan pulse from the (n−2)th stage, and electrically interconnects the set node Q and a charging voltage line when turned on. Exceptionally, the first switching device Tr1 of the first stage ST1 is controlled by the first start pulse Vst1 from the timing controller instead of the scan pulse from the (n−2)th stage. Similarly, the first switching device Tr1 of the second stage ST2 is controlled by the second start pulse Vst2 from the timing controller instead of the scan pulse from the (n−2)th stage.

The second switching device Tr2 of the nth stage is turned on or off in response to a clock pulse supplied to the output unit OB of the (n−1)th stage, and electrically interconnects the output terminal OT of the (n−1)th stage and the set node Q when turned on. The clock pulse supplied to the output unit OB of the (n−1)th stage means just a clock pulse supplied to a pull-up switching device Uc in the output unit OB of the (n−1)th stage.

The third switching device Tr3 of the nth stage is turned on or off in response to the charging voltage VDD from the charging voltage line, and electrically interconnects the charging voltage line and the reset node QB when turned on.

The fourth switching device Tr4 of the nth stage is turned on or off according to the signal state of the set node Q, and electrically interconnects the reset node QB and a discharging voltage line when turned on.

The output unit OB of the nth stage includes a pull-up switching device Uc and a pull-down switching device Ds.

The pull-up switching device Uc of the nth stage is turned on or off according to the signal state of the set node Q, and electrically interconnects the clock transfer line and the output terminal OT of the nth stage when turned on.

The pull-down switching device Ds of the nth stage is turned on or off according to the signal state of the reset node QB, and electrically interconnects the output terminal OT of the nth stage and the discharging voltage line when turned on.

The operation of a shift register including the stages according to the first embodiment of the present invention, configured in this manner, will hereinafter be described in detail. For convenience of description, the nth stage of FIG. 5 will be rewritten as the fourth stage ST4. Also, the following description will be given of operations in non-overlap periods between the first and second start pulses and between the clock pulses. It should be noted that, for overlap periods, operations in each of the overlap periods occur concurrently. For example, in a ⅓H period in which the first clock pulse CLK1 and the second clock pulse CLK2 overlap with each other, an operation based on the first clock pulse CLK1 and an operation based on the second clock pulse CLK2 may occur concurrently.

First, a description will be given of an operation in a first set period of the fourth stage ST4, namely, an enable operation of the fourth stage ST4. For example, the first set period of the fourth stage ST4 may correspond to a second ⅓H duration of the second clock pulse CLK2 (a duration corresponding to a second ⅓H period when the pulse width of the second clock pulse is equally divided into three durations). Also, this first set period may correspond to a duration in which the second clock pulse CLK2 does not overlap with clock pulses (i.e., the first and third clock pulses) adjacent thereto, among all the durations of the pulse width of the second clock pulse CLK2.

In this first set period, the second scan pulse SP2 output from the second stage ST2 is input to the fourth stage ST4.

That is, the second scan pulse SP2 is supplied to the gate terminal of the first switching device Tr1 provided in the fourth stage ST4 and the gate terminal of the second discharging switching device TD2 provided in the fourth stage ST4.

As a result, the first switching device Tr1 and the second discharging switching device TD2 are turned on, thereby causing the charging voltage VDD to be applied to the set node Q through the turned-on first switching device Tr1. Consequently, the set node Q is charged, and the pull-up switching device Uc and fourth switching device Tr4 of the fourth stage ST4 with their gate terminals connected to the charged set node Q are turned on.

Here, the discharging voltage VSS is supplied to the reset node QB of the fourth stage ST4 through the turned-on fourth switching device Tr4, and the fourth clock pulse CLK4 of a low voltage state is also supplied to this reset node QB through the turned-on second discharging switching device TD2. Accordingly, this reset node QB is discharged. As a result, the pull-down switching device Ds with its gate terminal connected to the reset node QB is turned off.

At this time, the third switching device Tr3 is always kept turned on by the charging voltage VDD supplied thereto because it has a diode structure with its gate terminal and drain terminal connected to each other. The charging voltage VDD is supplied to the reset node QB by the turned-on third switching device Tr3. That is, this reset node QB is supplied with the positive, charging voltage VDD simultaneously with the negative, discharging voltage VSS and the fourth clock pulse CLK4 of the low voltage state. However, because the area of each of the second discharging switching device TD2 and fourth switching device Tr4 is larger than that of the third switching device Tr3, the reset node QB is kept discharged.

On the other hand, for this first set period, the first discharging switching device TD1 provided in the fourth stage ST4 is left turned off because the sixth scan pulse of the low voltage state is output from the sixth stage ST6.

Next, a description will be given of an operation in a second set period of the fourth stage ST4. For example, the second set period of the fourth stage ST4 may correspond to a second ⅓H duration of the third clock pulse CLK3 (a duration corresponding to a second ⅓H period when the pulse width of the third clock pulse is equally divided into three durations). Also, this second set period may correspond to a duration in which the third clock pulse CLK3 does not overlap with clock pulses (i.e., the second and fourth clock pulses) adjacent thereto, among all the durations of the pulse width of the third clock pulse CLK3.

In this second set period, the third clock pulse CLK3 of a high voltage state is supplied to the gate terminal of the second switching device Tr2 provided in the fourth stage ST4, and the third scan pulse SP3 from the third stage ST3 is supplied to the drain terminal of the second switching device Tr2 of the fourth stage ST4. As a result, the second switching device Tr2 is turned on, and the third scan pulse SP3 of the high voltage state is supplied to the set node Q through the turned-on second switching device Tr2. Consequently, the set node Q of the fourth stage ST4 is also charged in the second set period subsequently to the first set period.

On the other hand, for this second set period, the first discharging switching device TD1 provided in the fourth stage ST4 is left turned off because the sixth scan pulse of the low voltage state is output from the sixth stage ST6.

Next, a description will be given of an operation in an output period of the fourth stage ST4. For example, the output period of the fourth stage ST4 may correspond to a second ⅓H duration of the fourth clock pulse CLK4 (a duration corresponding to a second ⅓H period when the pulse width of the fourth clock pulse CLK4 is equally divided into three durations). Also, this output period may correspond to a duration in which the fourth clock pulse CLK4 does not overlap with clock pulses (i.e., the third and first clock pulses) adjacent thereto, among all the durations of the pulse width of the fourth clock pulse CLK4.

In this output period of the fourth stage ST4, the set node Q of the fourth stage ST4 is kept charged by the charging voltage VDD applied thereto for the first and second set periods, so that the pull-up switching device Uc of the fourth stage ST4 is kept turned on. At this time, as the fourth clock pulse CLK4 is applied to the drain terminal of the turned-on pull-up switching device Uc, the charging voltage VDD charged at the floating set node Q of the fourth stage ST4 is amplified by bootstrapping.

Accordingly, the fourth clock pulse CLK4 applied to the drain terminal of the pull-up switching device Uc of the fourth stage ST4 is stably output through the source terminal (output terminal OT) of the pull-up switching device Uc.

Here, the fourth clock pulse CLK4 output through the pull-up switching device Uc is just the fourth scan pulse SP4. Particularly, for normal output of the output of the fourth stage ST4, namely, the fourth scan pulse SP4 in the output period of the fourth stage ST4, the voltage at the set node Q of the fourth stage ST4 needs to be stably maintained. This requires that the first discharging switching device TD1 be kept completely turned off for the output period of the fourth stage ST4. To this end, in the present invention, a clock pulse having a voltage higher than the existing discharging voltage VSS is supplied to the source terminal of the first discharging switching device TD1 instead of the discharging voltage VSS. For example, the fourth clock pulse CLK4 may be supplied to the source terminal of the first discharging switching device TD1 provided in the fourth stage ST4. That is, the same fourth clock pulse CLK4 is supplied to the drain terminal of the pull-up switching device Uc of the fourth stage ST4 and the source terminal of the first discharging switching device TD1 of the fourth stage ST4.

Because the sixth scan pulse of the low voltage state output from the sixth stage ST6 is still supplied to the gate terminal of the first discharging switching device TD1 of the fourth stage ST4, the first discharging switching device TD1 is left turned off even in this output period. However, when the discharging voltage VSS is supplied to the source terminal of the first discharging switching device TD1 as in a conventional shift register, the first discharging switching device TD1 may not be completely turned off, thereby generating leakage current. For example, in the case where the voltage of the sixth scan pulse of the low voltage state and the discharging voltage VSS are both about −5V and the set node Q is charged with a voltage of 20V, both voltages at the gate terminal and source terminal of the first discharging switching device TD1 may be maintained at −5V in the conventional shift register and a gate-source voltage Vgs of the first discharging switching device TD1 may thus be 0V. In this case, a threshold voltage of the first discharging switching device TD1, which is an N-type oxide semiconductor transistor, may move negatively due to the above-mentioned temperature influence, thereby causing the first discharging switching device TD1 not to be completely turned off in the output period. In order to prevent this, in the present invention, a clock pulse having a voltage higher than the discharging voltage VSS is supplied to the source terminal of the first discharging switching device TD1. For example, the first to fourth clock pulses CLK1 to CLK4 may all have a high value of about 20V in the high voltage state and a value of about −5V in the low voltage state. Because the fourth clock pulse CLK4 assumes the high voltage state in the output period of the fourth stage ST4, the fourth clock pulse CLK4 of the high voltage state is supplied to both the pull-up switching device Uc and first discharging switching device TD1 of the fourth stage ST4 in the output period of the fourth stage ST4. As a result, according to the present invention, the gate-source voltage of the first discharging switching device TD1 is maintained at a high negative value for the output period in which the pull-up switching device Uc outputs the fourth clock pulse CLK4. For example, assuming that the fourth clock pulse CLK4 of the high voltage state has a voltage of 20V and the sixth scan pulse of the low voltage state has a voltage of −5V, the gate-source voltage of the first discharging switching device TD1 may be −25V. In this case, it can be seen that the first discharging switching device TD1, which is an N-type oxide semiconductor transistor, is completely turned off for the output period of the fourth stage ST4.

On the other hand, in this output period, the second discharging switching device TD2 also operates in the same manner as the first discharging switching device TD1. However, because the voltage (about −5V) at the reset node QB is lower than the fourth clock pulse CLK4 of the high voltage state in the output period, the source and drain terminals of the second discharging switching device TD2 are opposite to the source and drain terminals of the first discharging switching device TD1. As a result, in the output period of the fourth stage ST4, a gate-source voltage of the second discharging switching device TD2 may be about 0V, so that the second discharging switching device TD2 may rather generate leakage current, thereby raising the voltage at the reset node QB. However, by making the area of the fourth switching device Tr4 larger than that of each of the second discharging switching device TD2 and third switching device Tr3 to improve discharging capabilities of the fourth switching device Tr4, it is possible to offset the voltage rise at the reset node QB resulting from the leakage current of the second discharging switching device TD2. As will be described later, the second discharging switching device TD2 acts to stably maintain the voltage at the reset node QB after a reset period.

In this manner, the clock pulse is supplied to the source terminal of the first discharging switching device TD1, so that the fourth scan pulse SP4 is stably output from the fourth stage ST4. This fourth scan pulse SP4 is supplied to a fourth gate line to drive it. Also, the fourth scan pulse SP4 is supplied to the drain terminal of a second switching device Tr2 of the fifth stage ST5 so that the fifth stage ST5 can perform a second set operation. Also, the fourth scan pulse SP4 is supplied to the gate terminals of a first switching device Tr1 and a second discharging switching device TD2 of the sixth stage ST6 so that the sixth stage ST6 can perform a first set operation. Also, the fourth scan pulse SP4 is supplied to the gate terminal of a first discharging switching device TD1 of the second stage ST2 so that the second stage ST2 can perform a reset operation.

Next, a description will be given of an operation in a reset period of the fourth stage ST4, namely, a disable operation of the fourth stage ST4. For example, the reset period of the fourth stage ST4 may correspond to a second ⅓H duration of the second clock pulse CLK2 (a duration corresponding to a second ⅓H period when the pulse width of the second clock pulse is equally divided into three durations). Also, this reset period may correspond to a duration in which the second clock pulse CLK2 does not overlap with clock pulses (i.e., the first and third clock pulses) adjacent thereto, among all the durations of the pulse width of the second clock pulse CLK2.

In this reset period, the sixth stage ST6 outputs the second clock pulse CLK2 as the sixth scan pulse SP6. This sixth scan pulse SP6 is supplied to the gate terminal of the first discharging switching device TD1 of the fourth stage ST4.

As a result, the first discharging switching device TD1 is turned on, and the fourth clock pulse CLK4 of the low voltage state is supplied to the set node Q of the fourth stage ST4 through the turned-on first discharging switching device TD1. Consequently, the set node Q is discharged, and the pull-up switching device Uc and fourth switching device Tr4, connected to the discharged set node Q through the gate terminals thereof, are turned off. Then, the charging voltage VDD is supplied to the reset node QB through the turned-on third switching device Tr3. Accordingly, the reset node QB is charged, and the pull-down switching device Ds, connected to the charged reset node QB through the gate terminal thereof, is turned on. As a result, the discharging voltage VSS is output at the output terminal OT through the turned-on pull-down switching device Ds.

On the other hand, whenever the fourth clock pulse CLK4 has the high voltage state again after the reset period of the fourth stage ST4, the second discharging switching device TD2 is kept completely turned off, so that the reset node QB of the fourth stage ST4 is periodically stabilized after the reset period.

The operation in the first set period and the operation in the second set period, described above, occur concurrently in an overlap period between the first set period and the second set period, the operation in the second set period and the operation in the output period, described above, occur concurrently in an overlap period between the second set period and the output period, and the operation in the output period and the operation in the reset period, described above, occur concurrently in an overlap period between the output period and the reset period.

Shift Register According to Second Embodiment

Figure 6:
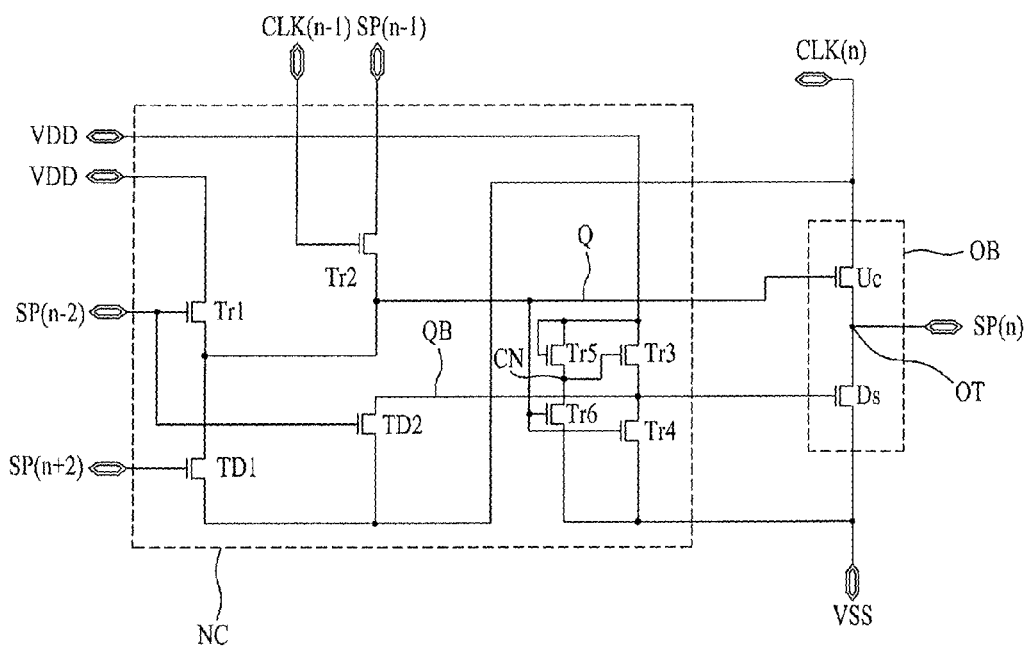
FIG. 6 is a circuit diagram of a stage according to a second embodiment of the present invention.

FIG. 6 is a circuit diagram of a stage according to a second embodiment of the present invention.

Each stage according to the second embodiment of the present invention includes a node controller NC and an output unit OB, as shown in FIG. 6. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof according to the signal states of the set node Q and reset node QB.

The node controller NC of the nth stage includes the set node Q, the reset node QB, first and second discharging switching devices TD1 and TD2, and first to sixth switching devices Tr1 to Tr6.

The first discharging switching device TD1 of the nth stage is turned on or off in response to the scan pulse from the (n+2)th stage, and electrically interconnects the set node Q and any one of a plurality of clock transfer lines when turned on.

The second discharging switching device TD2 of the nth stage is turned on or off in response to the scan pulse from the (n−2)th stage, and electrically interconnects the reset node QB and the clock transfer line when turned on.

The first switching device Tr1 of the nth stage is turned on or off in response to the scan pulse from the (n−2)th stage, and electrically interconnects the set node Q and a charging voltage line when turned on.

The second switching device Tr2 of the nth stage is turned on or off in response to a clock pulse supplied to the output unit OB of the (n−1)th stage, and electrically interconnects the output terminal OT of the (n−1)th stage and the set node Q when turned on.

The third switching device Tr3 of the nth stage is turned on or off according to a signal state of a common node CN, and electrically interconnects the charging voltage line and the reset node QB when turned on.

The fourth switching device Tr4 of the nth stage is turned on or off according to the signal state of the set node Q, and electrically interconnects the reset node QB and a discharging voltage line when turned on.

The fifth switching device Tr5 of the nth stage is turned on or off in response to the charging voltage VDD from the charging voltage line, and electrically interconnects the charging voltage line and the common node CN when turned on.

The sixth switching device Tr6 of the nth stage is turned on or off according to the signal state of the set node Q, and electrically interconnects the common node CN and the discharging voltage line when turned on.

The output unit OB of the nth stage includes a pull-up switching device Uc and a pull-down switching device Ds.

The pull-up switching device Uc of the nth stage is turned on or off according to the signal state of the set node Q, and electrically interconnects the clock transfer line and the output terminal OT of the nth stage when turned on.

The pull-down switching device Ds of the nth stage is turned on or off according to the signal state of the reset node QB, and electrically interconnects the output terminal OT of the nth stage and the discharging voltage line when turned on.

The third to sixth switching devices Tr3 to Tr6 in the second embodiment correspond to the third and fourth switching devices Tr3 and Tr4 in the first embodiment. The fifth and sixth switching devices Tr5 and Tr6 in the second embodiment control a voltage level of the common node CN. Whether the fifth switching device Tr5 will be turned on is determined according to the level of a voltage supplied to the common node CN.

Shift Register According to Third Embodiment

Figure 7:
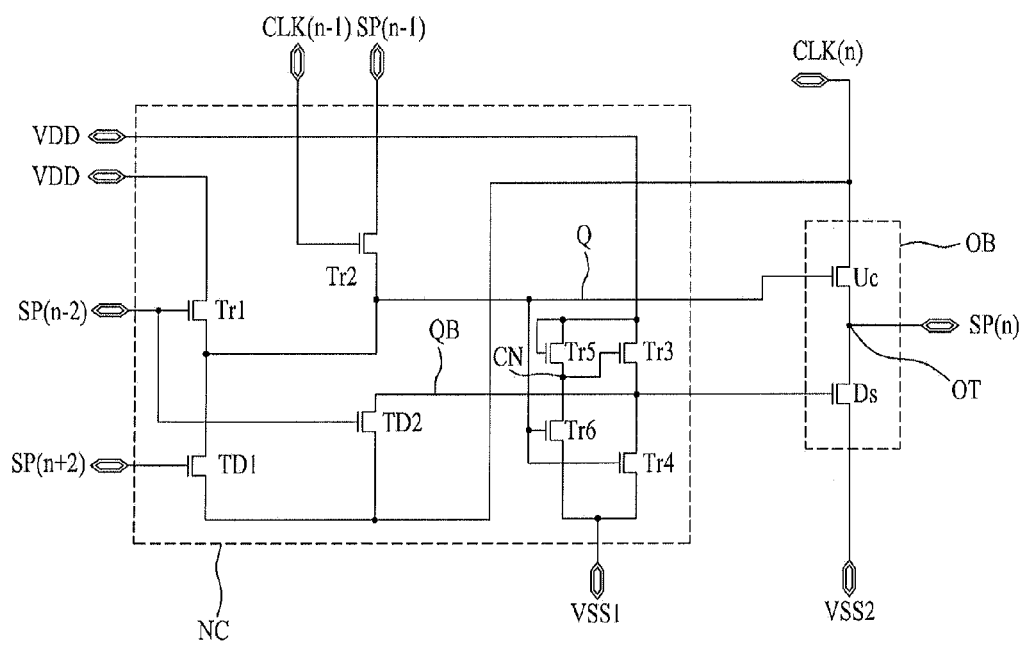
FIG. 7 is a circuit diagram of a stage according to a third embodiment of the present invention.

FIG. 7 is a circuit diagram of a stage according to a third embodiment of the present invention.

Each stage according to the third embodiment of the present invention includes a node controller NC and an output unit OB, as shown in FIG. 7. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof according to the signal states of the set node Q and reset node QB.

The node controller NC of the nth stage includes first and second discharging switching devices TD1 and TD2, and first to sixth switching devices Tr1 to Tr6.

The first discharging switching device TD1 of the node controller NC of the nth stage is turned on or off in response to the scan pulse from the (n+2)th stage, and electrically interconnects the set node Q and any one of a plurality of clock transfer lines when turned on.

The second discharging switching device TD2 of the node controller NC of the nth stage is turned on or off in response to the scan pulse from the (n−2)th stage, and electrically interconnects the reset node QB and the clock transfer line when turned on.

The first switching device Tr1 of the nth stage is turned on or off in response to the scan pulse from the (n−2)th stage, and electrically interconnects the set node Q and a charging voltage line when turned on.

The second switching device Tr2 of the nth stage is turned on or off in response to a clock pulse supplied to the output unit OB of the (n−1)th stage, and electrically interconnects the output terminal OT of the (n−1)th stage and the set node Q when turned on.

The third switching device Tr3 of the nth stage is turned on or off in response to a voltage supplied to a common node CN, and electrically interconnects the charging voltage line and the reset node QB when turned on.

The fourth switching device Tr4 of the nth stage is turned on or off in response to a voltage supplied to the set node Q, and electrically interconnects the reset node QB and a first discharging voltage line when turned on.

The fifth switching device Tr5 of the nth stage is turned on or off in response to the charging voltage VDD from the charging voltage line, and electrically interconnects the charging voltage line and the common node CN when turned on.

The sixth switching device Tr6 of the nth stage is turned on or off in response to the voltage supplied to the set node Q, and electrically interconnects the common node CN and the first discharging voltage line when turned on.

The output unit OB of the nth stage includes a pull-up switching device Uc and a pull-down switching device Ds.

The pull-up switching device Uc is turned on or off in response to the voltage supplied to the set node Q, and electrically interconnects the clock transfer line and the output terminal OT of the nth stage when turned on.

The pull-down switching device Ds is turned on or off in response to a voltage supplied to the reset node QB, and electrically interconnects the output terminal OT of the nth stage and a second discharging voltage line when turned on.

The first discharging voltage line transfers a first discharging voltage VSS1, which is lower than the charging voltage VDD.

The second discharging voltage line transfers a second discharging voltage VSS2, which is lower than or equal to the first discharging voltage VSS1. The second discharging voltage VSS2 is the same as the discharging voltage VSS in the above-stated first embodiment.

In the third embodiment of the present invention, leakage currents of the fourth and sixth switching devices Tr4 and Tr6 may be prevented by setting the level of the first discharging voltage VSS1 supplied to the fourth and sixth switching devices Tr4 and Tr6 to be lower than or equal to that of the second discharging voltage VSS2.

Shift Register According to Fourth Embodiment

Figure 8:
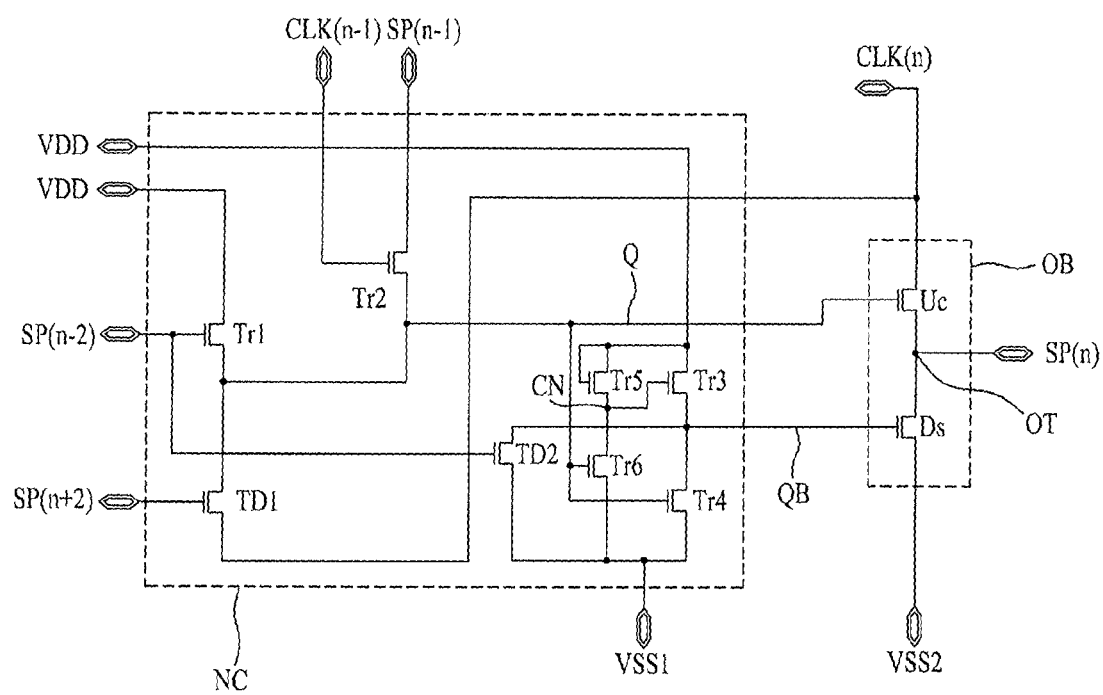
FIG. 8 is a circuit diagram of a stage according to a fourth embodiment of the present invention.

FIG. 8 is a circuit diagram of a stage according to a fourth embodiment of the present invention.

Each stage according to the fourth embodiment of the present invention includes a node controller NC and an output unit OB, as shown in FIG. 8. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes first and second discharging switching devices TD1 and TD2, and first to sixth switching devices Tr1 to Tr6.

The first discharging switching device TD1 of the node controller NC of the nth stage is turned on or off in response to the scan pulse from the (n+2)th stage, and electrically interconnects the set node Q and any one of a plurality of clock transfer lines when turned on.

The second discharging switching device TD2 of the node controller NC of the nth stage is turned on or off in response to the scan pulse from the (n−2)th stage, and electrically interconnects the reset node QB and a first discharging voltage line when turned on.

The first switching device Tr1 of the nth stage is turned on or off in response to the scan pulse from the (n−2)th stage, and electrically interconnects the set node Q and a charging voltage line when turned on.

The second switching device Tr2 of the nth stage is turned on or off in response to a clock pulse supplied to the output unit OB of the (n−1)th stage, and electrically interconnects the output terminal OT of the (n−1)th stage and the set node Q when turned on.

The third switching device Tr3 of the nth stage is turned on or off in response to a voltage supplied to a common node CN, and electrically interconnects the charging voltage line and the reset node QB when turned on.

The fourth switching device Tr4 of the nth stage is turned on or off in response to the voltage supplied to the set node Q, and electrically interconnects the reset node QB and the first discharging voltage line when turned on.

The fifth switching device Tr5 of the nth stage is turned on or off in response to the charging voltage VDD from the charging voltage line, and electrically interconnects the charging voltage line and the common node CN when turned on.

The sixth switching device Tr6 of the nth stage is turned on or off in response to the voltage supplied to the set node Q, and electrically interconnects the common node CN and the first discharging voltage line when turned on.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and a second discharging voltage line when turned on.

First and second discharging voltages VSS1 and VSS2 in the fourth embodiment of the present invention are the same as the first and second discharging voltages VSS1 and VSS2 in the above-stated third embodiment, respectively.

Shift Register According to Fifth Embodiment

Figure 9:
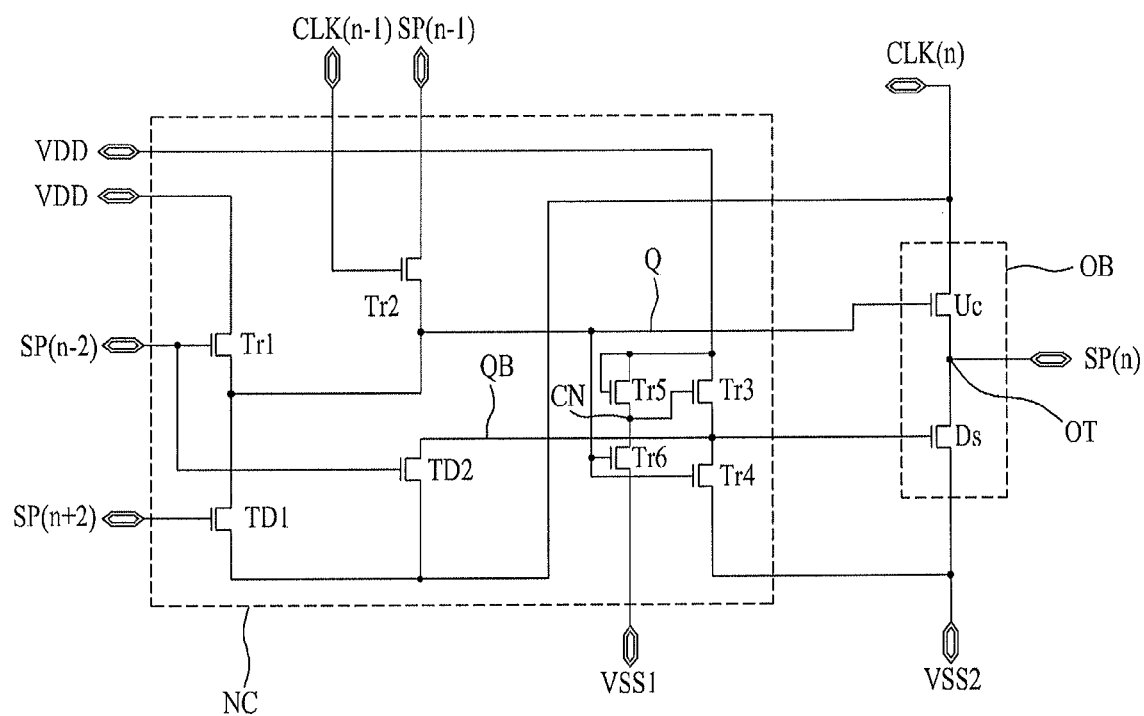
FIG. 9 is a circuit diagram of a stage according to a fifth embodiment of the present invention.

FIG. 9 is a circuit diagram of a stage according to a fifth embodiment of the present invention.

Each stage according to the fifth embodiment of the present invention includes a node controller NC and an output unit OB, as shown in FIG. 9. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes first and second discharging switching devices TD1 and TD2, and first to sixth switching devices Tr1 to Tr6.

The first discharging switching device TD1 of the node controller NC of the nth stage is turned on or off in response to the scan pulse from the (n+2)th stage, and electrically interconnects the set node Q and any one of a plurality of clock transfer lines when turned on.

The second discharging switching device TD2 of the node controller NC of the nth stage is turned on or off in response to the scan pulse from the (n−2)th stage, and electrically interconnects the reset node QB and the clock transfer line when turned on.

The first switching device Tr1 of the nth stage is turned on or off in response to the scan pulse from the (n−2)th stage, and electrically interconnects the set node Q and a charging voltage line when turned on.

The second switching device Tr2 of the nth stage is turned on or off in response to a clock pulse supplied to the output unit OB of the (n−1)th stage, and electrically interconnects the output terminal OT of the (n−1)th stage and the set node Q when turned on.

The third switching device Tr3 of the nth stage is turned on or off in response to a voltage supplied to a common node CN, and electrically interconnects the charging voltage line and the reset node QB when turned on.

The fourth switching device Tr4 of the nth stage is turned on or off in response to the voltage supplied to the set node Q, and electrically interconnects the reset node QB and a second discharging voltage line when turned on.

The fifth switching device Tr5 of the nth stage is turned on or off in response to the charging voltage VDD from the charging voltage line, and electrically interconnects the charging voltage line and the common node CN when turned on.

The sixth switching device Tr6 of the nth stage is turned on or off in response to the voltage supplied to the set node Q, and electrically interconnects the common node CN and a first discharging voltage line when turned on.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the second discharging voltage line when turned on.

First and second discharging voltages VSS1 and VSS2 in the fifth embodiment of the present invention are the same as the first and second discharging voltages VSS1 and VSS2 in the above-stated third embodiment, respectively.

Shift Register According to Sixth Embodiment

Figure 10:
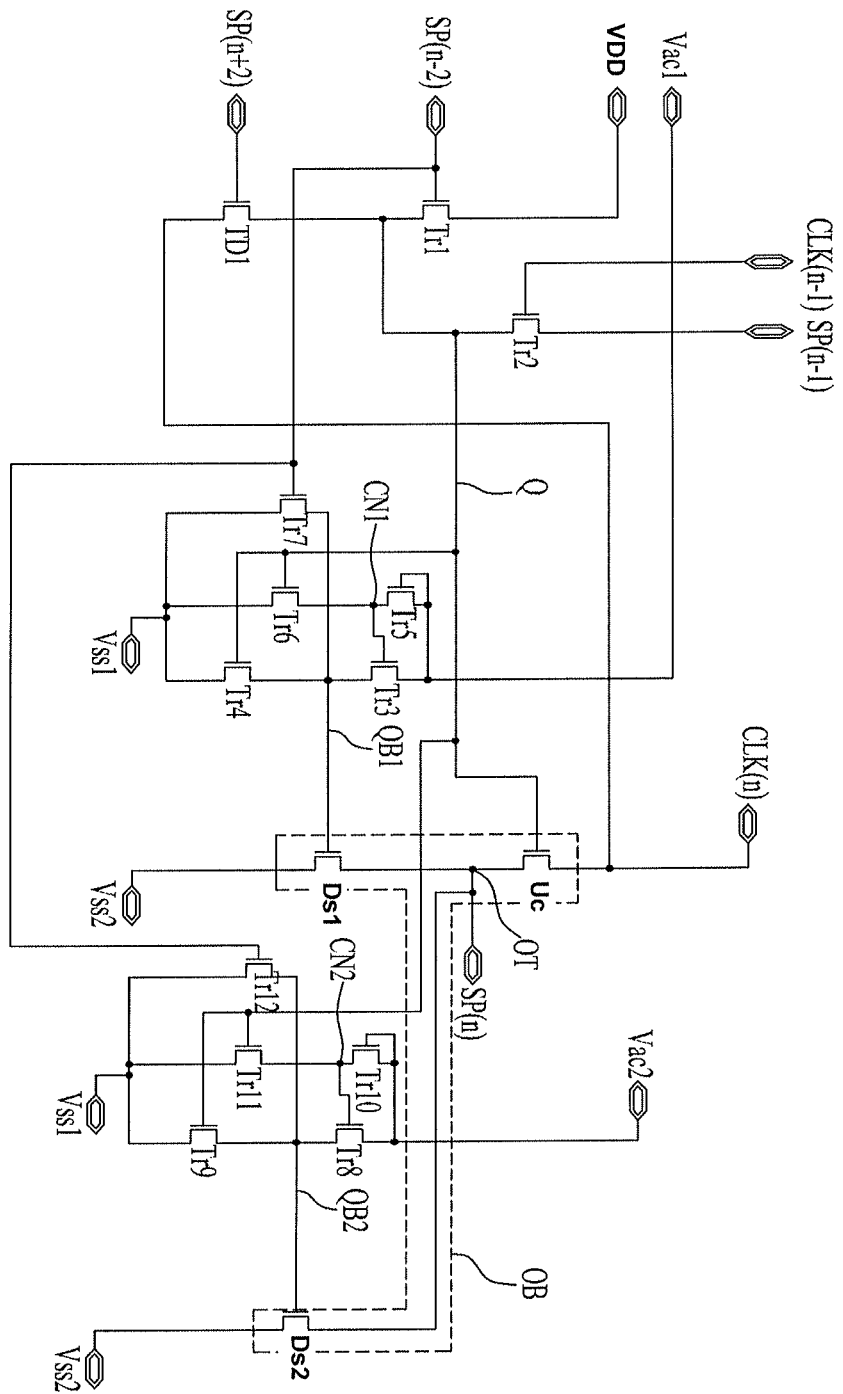
FIG. 10 is a circuit diagram of a stage according to a sixth embodiment of the present invention.

FIG. 10 is a circuit diagram of a stage according to a sixth embodiment of the present invention.

Each stage according to the sixth embodiment of the present invention includes a node controller and an output unit OB, as shown in FIG. 10. The node controller controls signal states of a set node Q, a first reset node QB1 and a second reset node QB2 of a corresponding stage. The output unit OB is supplied with any one of a plurality of clock pulses having different phases, and outputs the supplied clock pulse as a scan pulse through an output terminal OT thereof in response to voltages supplied to the set node Q, first reset node QB1 and second reset node QB2.

The node controller of the nth stage includes a first discharging switching device TD1, and first to twelfth switching devices Tr1 to Tr12.

The first discharging switching device TD1 of the nth stage is turned on or off in response to the scan pulse from the (n+2)th stage, and electrically interconnects the set node Q and any one of a plurality of clock transfer lines when turned on.

The first switching device Tr1 of the nth stage is turned on or off in response to the scan pulse from the (n−2)th stage, and electrically interconnects the set node Q and a charging voltage line when turned on.

The second switching device Tr2 of the nth stage is turned on or off in response to a clock pulse supplied to the output unit OB of the (n−1)th stage, and electrically interconnects the output terminal OT of the (n−1)th stage and the set node Q when turned on.

The third switching device Tr3 of the nth stage is turned on or off in response to a voltage supplied to a first common node CN1, and electrically interconnects a first AC voltage line and the first reset node QB1 when turned on.

The fourth switching device Tr4 of the nth stage is turned on or off in response to the voltage supplied to the set node Q, and electrically interconnects the first reset node QB1 and a first discharging voltage line when turned on.

The fifth switching device Tr5 of the nth stage is turned on or off in response to the first AC voltage Vac1 from the first AC voltage line, and electrically interconnects the first AC voltage line and the first common node CN1 when turned on.

The sixth switching device Tr6 of the nth stage is turned on or off in response to the voltage supplied to the set node Q, and electrically interconnects the first common node CN1 and the first discharging voltage line when turned on.

The seventh switching device Tr7 of the nth stage is turned on or off in response to the scan pulse from the (n−2)th stage, and electrically interconnects the first reset node QB1 and the first discharging voltage line when turned on.

The eighth switching device Tr8 of the nth stage is turned on or off in response to a voltage supplied to a second common node CN2, and electrically interconnects a second AC voltage line and the second reset node QB2 when turned on.

The ninth switching device Tr9 of the nth stage is turned on or off in response to the voltage supplied to the set node Q, and electrically interconnects the second reset node QB2 and the first discharging voltage line when turned on.

The tenth switching device Tr10 of the nth stage is turned on or off in response to the second AC voltage Vac2 from the second AC voltage line, and electrically interconnects the second AC voltage line and the second common node CN2 when turned on.

The eleventh switching device Tr11 of the nth stage is turned on or off in response to the voltage supplied to the set node Q, and electrically interconnects the second common node CN2 and the first discharging voltage line when turned on.

The twelfth switching device Tr12 of the nth stage is turned on or off in response to the scan pulse from the (n−2)th stage, and electrically interconnects the second reset node QB2 and the first discharging voltage line when turned on.

The output unit OB of the nth stage includes a pull-up switching device Uc, a first pull-down switching device Ds1, and a second pull-down switching device Ds2.

The pull-up switching device Uc of the nth stage is turned on or off in response to the voltage supplied to the set node Q, and electrically interconnects the clock transfer line and the output terminal OT of the nth stage when turned on.

The first pull-down switching device Ds1 of the nth stage is turned on or off in response to the voltage supplied to the first reset node QB1, and electrically interconnects the output terminal OT of the nth stage and a second discharging voltage line when turned on.

The second pull-down switching device Ds2 of the nth stage is turned on or off in response to the voltage supplied to the second reset node QB2, and electrically interconnects the output terminal OT of the nth stage and the second discharging voltage line when turned on.

Each stage according to the sixth embodiment of the present invention includes the first and second reset nodes QB1 and QB2, which are alternately charged on a frame period basis. For example, in an odd frame period, the first reset node QB1 may be charged and the second reset node QB2 may be discharged, and, in an even frame period, the first reset node QB1 may be discharged and the second reset node QB2 may be charged.

In detail, both the first and second reset nodes QB1 and QB2 are kept discharged in a set period in which the set node Q is charged, whereas any one of the first and second reset nodes QB1 and QB2 is charged and the other is discharged, in a reset period in which the set node Q is discharged. In the reset period, the first and second reset nodes QB1 and QB2 are alternately charged on a frame period basis. As a result, when the first pull-down switching device Ds1 connected to the first reset node QB1 is turned on in the reset period in the odd frame period, the second pull-down switching device Ds2 connected to the second reset node QB2 is turned off. Conversely, when the first pull-down switching device Ds1 connected to the first reset node QB1 is turned off in the reset period in the even frame period, the second pull-down switching device Ds2 connected to the second reset node QB2 is turned on.

For this operation, instead of the charging voltage VDD, the first AC voltage Vac1 is supplied to the third and fifth switching devices Tr3 and Tr5 and the second AC voltage Vac2, which is 180° phase-inverted with respect to the first AC voltage Vac1, is supplied to the eighth and tenth switching devices Tr8 and Tr10.

First and second discharging voltages VSS1 and VSS2 in the sixth embodiment of the present invention are the same as the first and second discharging voltages VSS1 and VSS2 in the above-stated third embodiment, respectively.

Shift Register According to Seventh Embodiment

Figure 11:
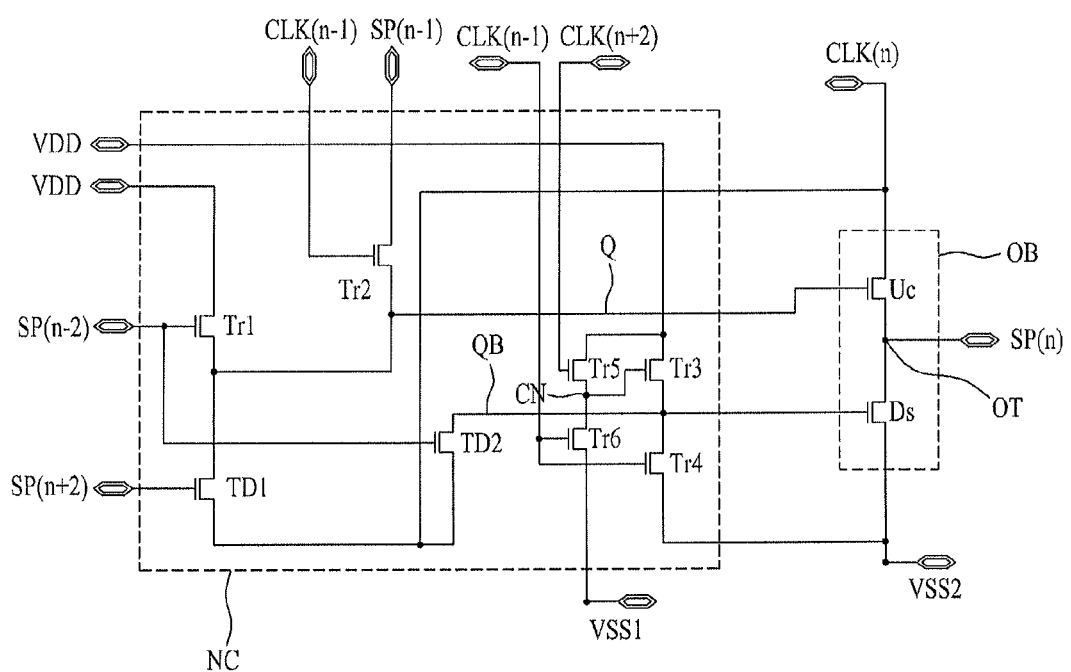
FIG. 11 is a circuit diagram of a stage according to a seventh embodiment of the present invention.

FIG. 11 is a circuit diagram of a stage according to a seventh embodiment of the present invention.

Each stage according to the seventh embodiment of the present invention includes a node controller NC and an output unit OB, as shown in FIG. 11. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes first and second discharging switching devices TD1 and TD2, and first to sixth switching devices Tr1 to Tr6.

The first discharging switching device TD1 of the nth stage is turned on or off in response to the scan pulse from the (n+2)th stage, and electrically interconnects the set node Q and any one of a plurality of clock transfer lines when turned on.

The second discharging switching device TD2 of the nth stage is turned on or off in response to the scan pulse from the (n−2)th stage, and electrically interconnects the reset node QB and the clock transfer line when turned on.

The first switching device Tr1 of the nth stage is turned on or off in response to the scan pulse from the (n−2)th stage, and electrically interconnects the set node Q and a charging voltage line when turned on.

The second switching device Tr2 of the nth stage is turned on or off in response to a clock pulse supplied to the output unit OB of the (n−1)th stage, and electrically interconnects the output terminal OT of the (n−1)th stage and the set node Q when turned on.

The third switching device Tr3 of the nth stage is turned on or off in response to a voltage supplied to a common node CN, and electrically interconnects the charging voltage line and the reset node QB when turned on.

The fourth switching device Tr4 of the nth stage is turned on or off in response to any one of the clock pulse supplied to the output unit OB of the (n−1)th stage and a clock pulse supplied to the output unit OB of the (n−2)th stage, and electrically interconnects the reset node QB and a second discharging voltage line when turned on.

The fifth switching device Tr5 of the nth stage is turned on or off in response to any one of a clock pulse supplied to the output unit OB of the (n+2)th stage and a clock pulse supplied to the output unit OB of the (n+3)th stage, and electrically interconnects the charging voltage line and the common node CN when turned on.

The sixth switching device Tr6 of the nth stage is turned on or off in response to any one of the clock pulse supplied to the output unit OB of the (n−1)th stage and the clock pulse supplied to the output unit OB of the (n−2)th stage, and electrically interconnects the common node CN and a first discharging voltage line when turned on.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the second discharging voltage line when turned on.

The fifth switching device Tr5 in the seventh embodiment is supplied with a clock pulse supplied to a pull-up switching device Uc of a downstream stage. For example, a clock pulse supplied to the fifth switching device Tr5 of the fourth stage ST4 may be the second clock pulse CLK2 supplied to a pull-up switching device Uc of the sixth stage ST4.

First and second discharging voltages VSS1 and VSS2 in the seventh embodiment of the present invention are the same as the first and second discharging voltages VSS1 and VSS2 in the above-stated third embodiment, respectively.

Shift Register According to Eighth Embodiment

Figure 12:
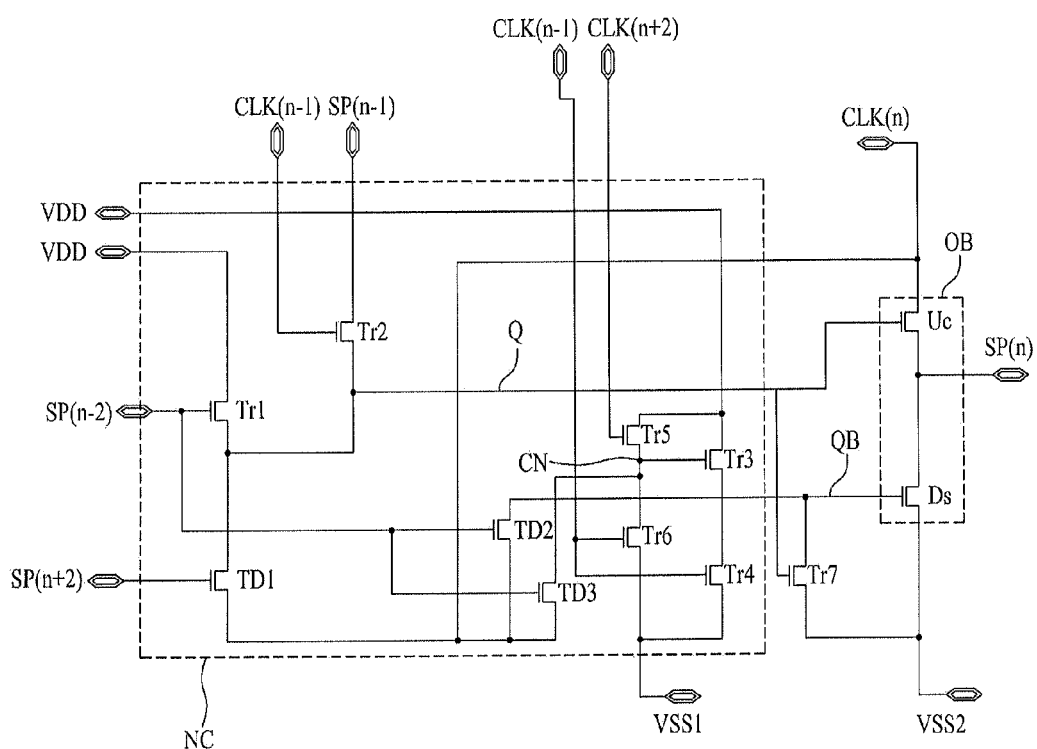
FIG. 12 is a circuit diagram of a stage according to an eighth embodiment of the present invention.

FIG. 12 is a circuit diagram of a stage according to an eighth embodiment of the present invention.

Each stage according to the eighth embodiment of the present invention includes a node controller NC and an output unit OB, as shown in FIG. 12. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes first to third discharging switching devices TD1 to TD3, and first to seventh switching devices Tr1 to Tr7.

The first discharging switching device TD1 of the nth stage is turned on or off in response to the scan pulse from the (n+2)th stage, and electrically interconnects the set node Q and any one of a plurality of clock transfer lines when turned on.

The second discharging switching device TD2 of the nth stage is turned on or off in response to the scan pulse from the (n−2)th stage, and electrically interconnects the reset node QB and the clock transfer line when turned on.

The third discharging switching device TD3 of the nth stage is turned on or off in response to the scan pulse from the (n−2)th stage, and electrically interconnects a common node CN and the clock transfer line when turned on.

The first switching device Tr1 of the nth stage is turned on or off in response to the scan pulse from the (n−2)th stage, and electrically interconnects the set node Q and a charging voltage line when turned on.

The second switching device Tr2 of the nth stage is turned on or off in response to a clock pulse supplied to the output unit OB of the (n−1)th stage, and electrically interconnects the output terminal OT of the (n−1)th stage and the set node Q when turned on.

The third switching device Tr3 of the nth stage is turned on or off in response to a voltage supplied to the common node CN, and electrically interconnects the charging voltage line and the reset node QB when turned on.

The fourth switching device Tr4 of the nth stage is turned on or off in response to any one of the clock pulse supplied to the output unit OB of the (n−1)th stage and a clock pulse supplied to the output unit OB of the (n−2)th stage, and electrically interconnects the reset node QB and a first discharging voltage line when turned on.

The fifth switching device Tr5 of the nth stage is turned on or off in response to any one of a clock pulse supplied to the output unit OB of the (n+2)th stage and a clock pulse supplied to the output unit OB of the (n+3)th stage, and electrically interconnects the charging voltage line and the common node CN when turned on.

The sixth switching device Tr6 of the nth stage is turned on or off in response to any one of the clock pulse supplied to the output unit OB of the (n−1)th stage and the clock pulse supplied to the output unit OB of the (n−2)th stage, and electrically interconnects the common node CN and the first discharging voltage line when turned on.

The seventh switching device Tr7 of the nth stage is turned on or off in response to the voltage supplied to the set node Q, and electrically interconnects the reset node QB and a second discharging voltage line when turned on.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the second discharging voltage line when turned on.

The fifth switching device Tr5 in the eighth embodiment is supplied with a clock pulse supplied to a pull-up switching device Uc of a downstream stage. For example, a clock pulse supplied to the fifth switching device Tr5 of the fourth stage ST4 may be the second clock pulse CLK2 supplied to a pull-up switching device Uc of the sixth stage ST4.

First and second discharging voltages VSS1 and VSS2 in the eighth embodiment of the present invention are the same as the first and second discharging voltages VSS1 and VSS2 in the above-stated third embodiment, respectively.

Figure 13:
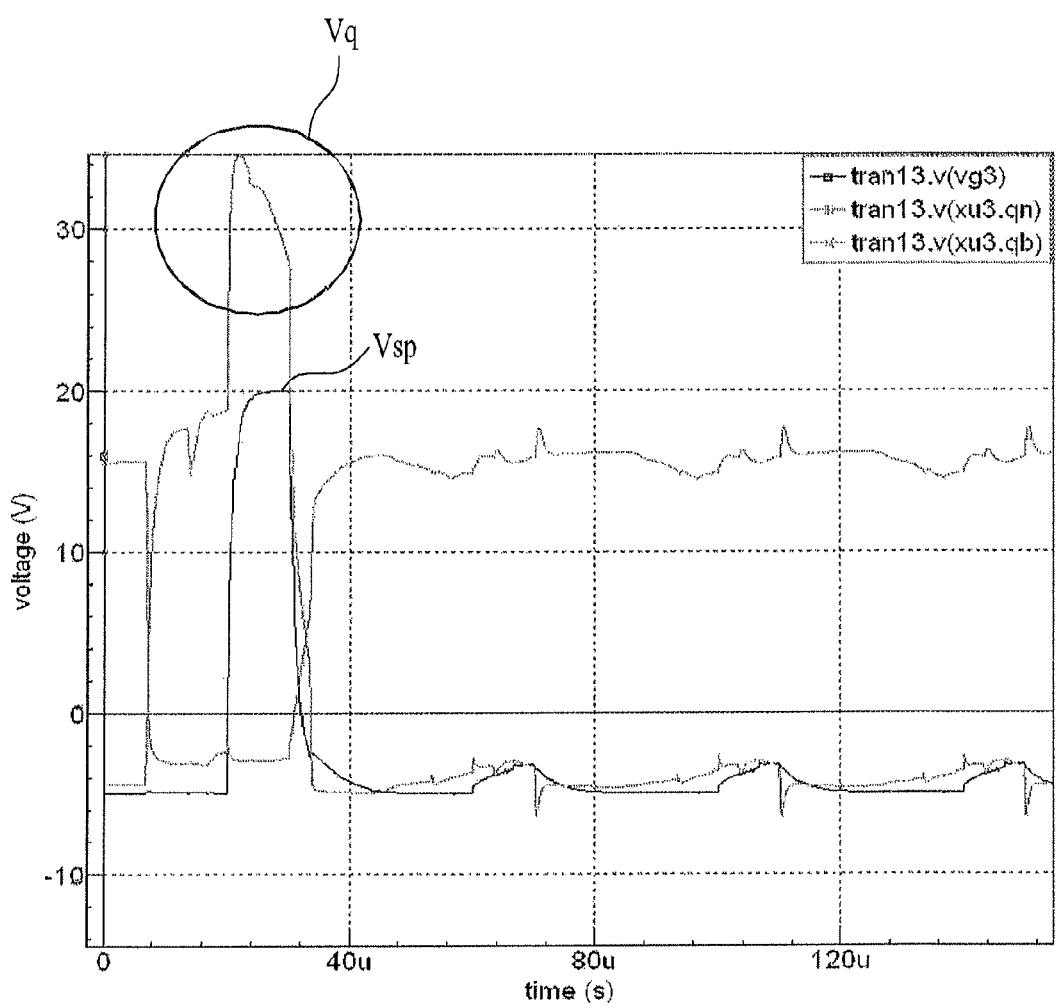
FIGS. 13 and 14 are waveform diagrams of a voltage at a set node and a voltage of a scan pulse, generated by the shift register of FIG. 3.
Figure 14:
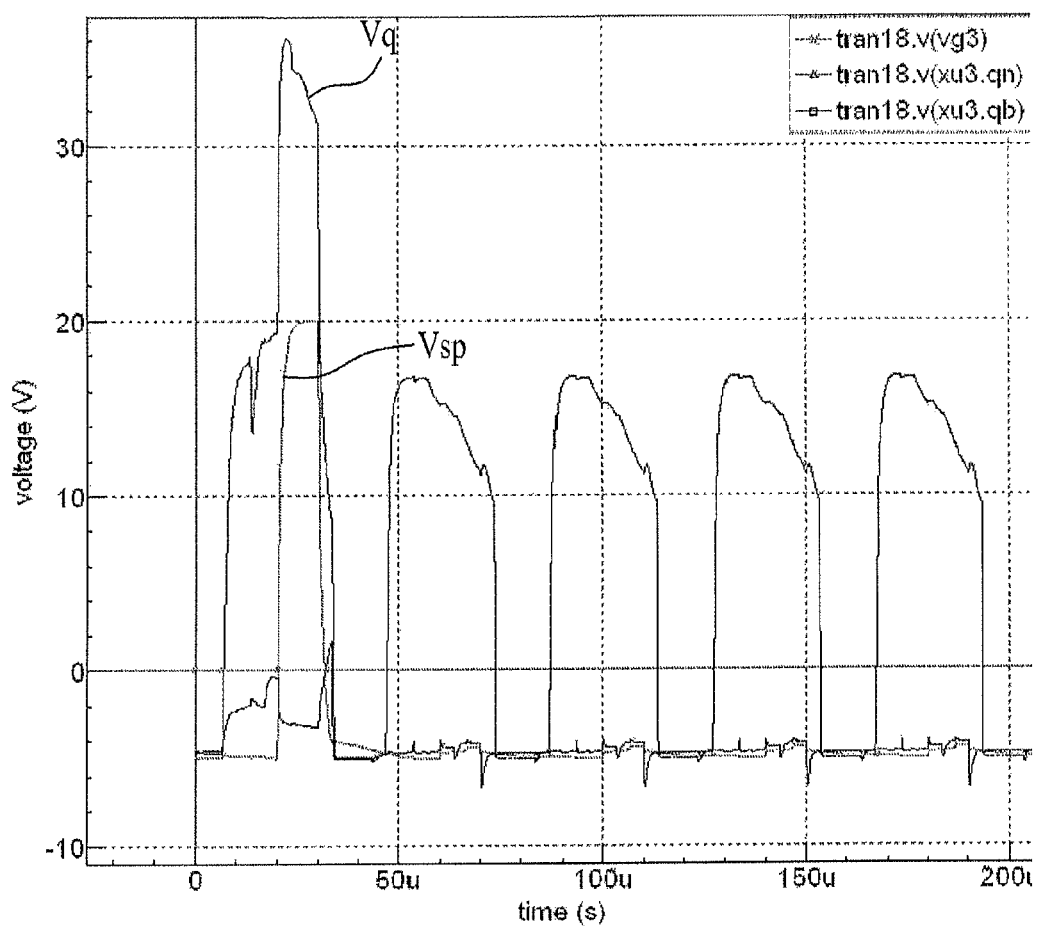

FIGS. 13 and 14 are waveform diagrams of a voltage at a set node and a voltage of a scan pulse, generated by the shift register of FIG. 3. It can be seen from FIGS. 13 and 14 that the voltage at the set node, indicated by Vq, and the voltage of the scan pulse, indicated by Vsp, are both normally output.

On the other hand, in all the embodiments, when voltages to be compared with each other have the same polarity, the comparison is made based on, not the absolute values of the levels of the voltages, but the levels themselves. For example, the second discharging voltage VSS2 and first discharging voltage VSS1 in the third embodiment may both be negative. In this case, that the second discharging voltage VSS2 is lower than the first discharging voltage VSS1 means that the first discharging voltage VSS1 is, for example, −5V if the second discharging voltage VSS2 is, for example, −10V.

Figure 15:
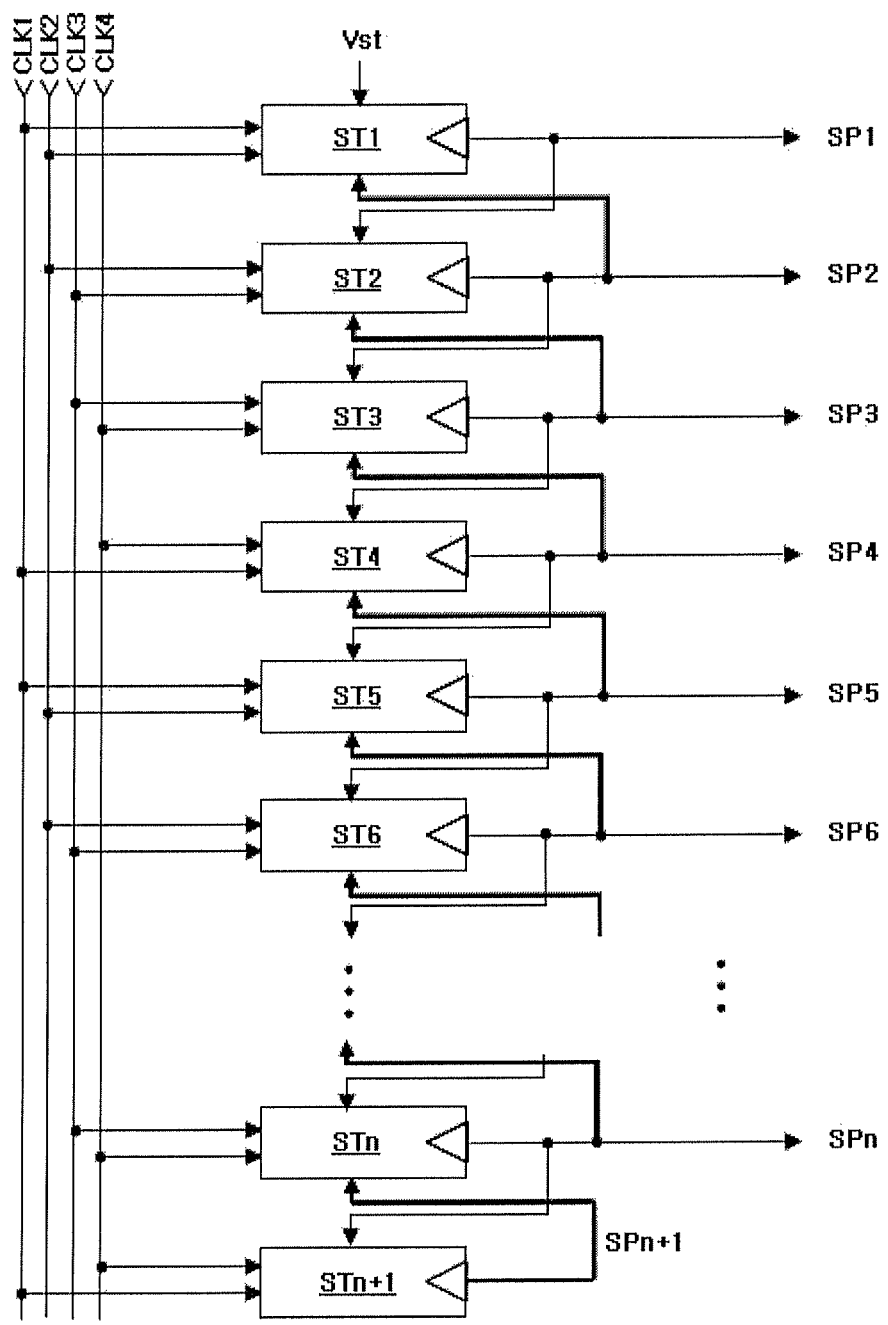
FIG. 15 is a block diagram showing the configuration of a shift register according to another embodiment of the present invention.
Figure 16:
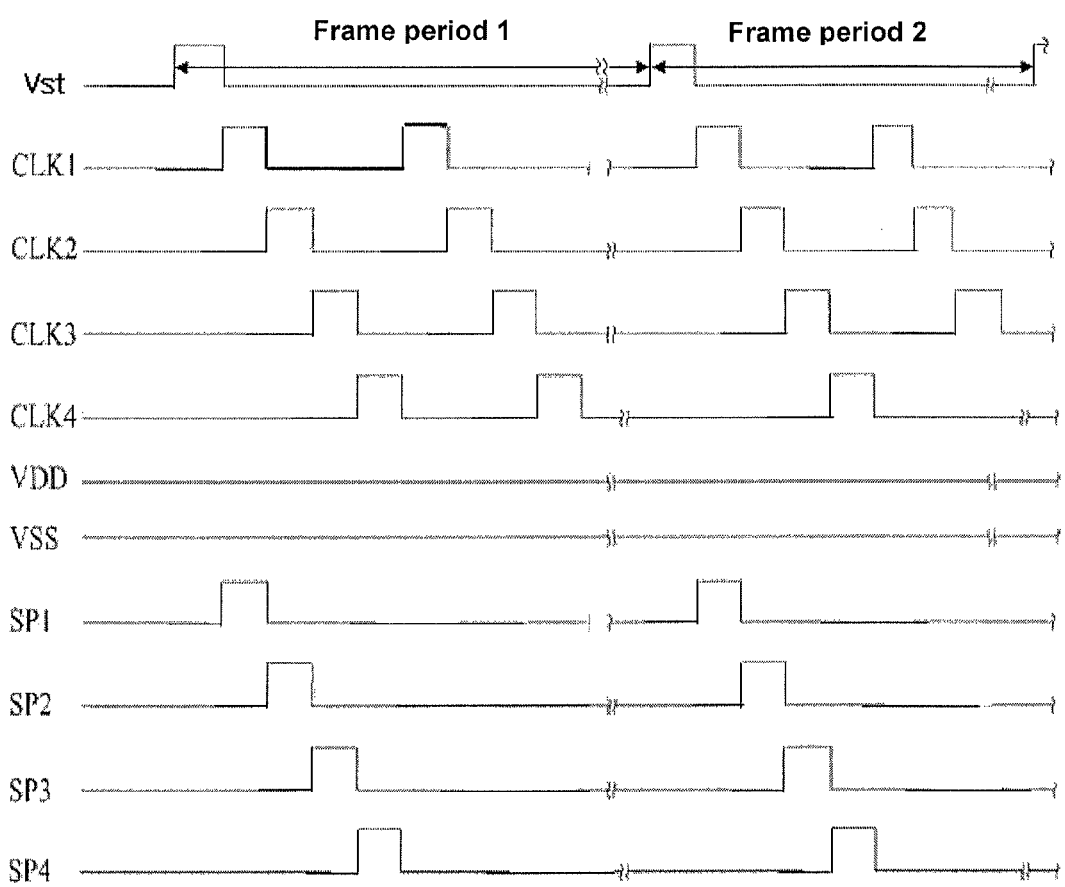
FIG. 16 is a timing diagram of various signals which are supplied to the shift register of FIG. 15 and various signals which are output therefrom.

FIG. 15 is a block diagram showing the configuration of a shift register according to another embodiment of the present invention, and FIG. 16 is a timing diagram of various signals which are supplied to the shift register of FIG. 15 and various signals which are output therefrom.

The shift register according to the present embodiment includes n stages ST1 to STn and one dummy stage STn+1, as shown in FIG. 15. Each of the stages ST1 to STn+1 outputs one scan pulse SP1 to SPn+1 for one frame period through an output terminal OT thereof.

Each of the stages ST1 to STn drives a gate line connected thereto using the scan pulse. Also, each of all the stages ST1 to STn+1 including the dummy stage controls the operations of a stage downstream therefrom and a stage upstream therefrom using the scan pulse.

The stages ST1 to STn+1 output the scan pulses in order from the first stage ST1 to the dummy stage STn+1. That is, the first stage ST1 outputs the first scan pulse SP1, the second stage ST2 then outputs the second scan pulse SP2, the third stage ST3 then outputs the third scan pulse SP3, . . . , the nth stage STn then outputs the nth scan pulse SPn, and the dummy stage STn+1 finally outputs the (n+1)th scan pulse SPn+1.

The scan pulses output from the stages ST1 to STn, other than the dummy stage STn+1, are sequentially supplied to gate lines of a liquid crystal panel (not shown) to sequentially scan the gate lines. Also, the scan pulse output from each of the stages is supplied only to an upstream stage, is supplied to the upstream stage and a downstream stage or is supplied only to the downstream stage.

This shift register may be built in the liquid crystal panel. That is, the liquid crystal panel has a display region for displaying an image, and a non-display region surrounding the display region, and the shift register is built in the non-display region.

Each of all the stages ST1 to STn+1 of the shift register, configured in this manner, is supplied with a charging voltage VDD, a discharging voltage VSS, and any two of first to fourth clock pulses CLK1 to CLK4 which are output sequentially out of phase with one another and cyclically. On the other hand, the first stage ST1 and dummy stage STn+1 among the stages ST1 to STn+1 are further supplied with a start pulse Vst.

The charging voltage VDD, discharging voltage VSS and first to fourth clock pulses CLK1 to CLK4 are the same as those stated previously, and a description thereof will thus be omitted. Exceptionally, the first to fourth clock pulses CLK1 to CLK4 shown in FIG. 16 do not overlap with one another. Of course, the start pulse Vst does not overlap with the clock pulses CLK1 to CLK4, either.

Although the four types of clock pulses having different phases are used for illustrative purposes in the present invention, any number of types of clock pulses may be used as long as they are two or more.

As shown in FIG. 15, a kth stage is enabled in response to a scan pulse from a (k−1)th stage. Here, k is a natural number. Exceptionally, the first stage ST1 is enabled in response to the start pulse Vst from a timing controller (not shown).

The kth stage is disabled in response to a scan pulse from a (k+1)th stage. Exceptionally, the dummy stage STn+1 is disabled in response to the start pulse Vst from the timing controller.

Hereinafter, a circuit configuration of each stage shown in FIG. 15 will be described in detail.

Shift Register According to Ninth Embodiment

Figure 17:
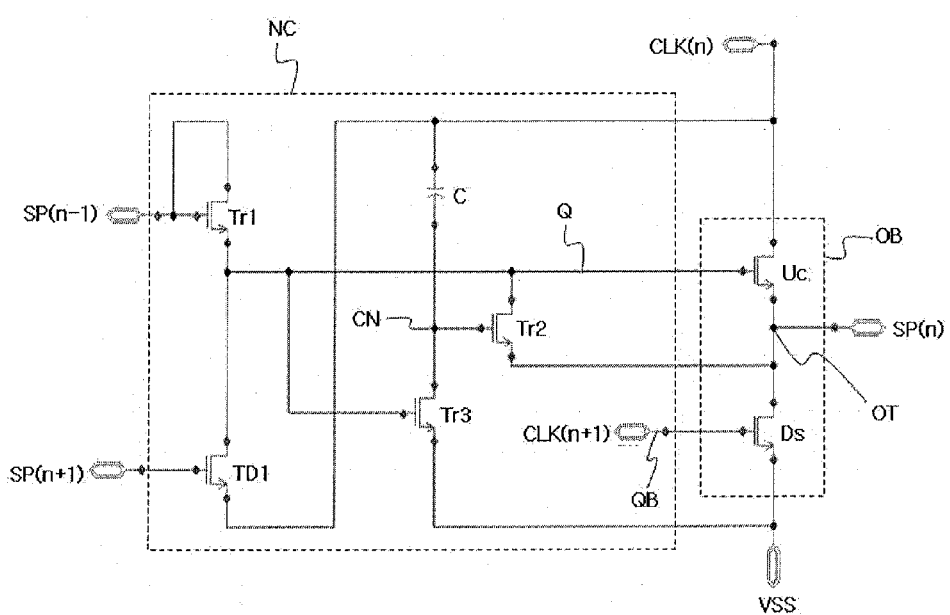
FIG. 17 is a circuit diagram of a stage according to a ninth embodiment of the present invention.

FIG. 17 is a circuit diagram of a stage according to a ninth embodiment of the present invention.

Each stage according to the ninth embodiment of the present invention includes a node controller NC and an output unit OB, as shown in FIG. 17. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to third switching devices Tr1 to Tr3, and a capacitor C.

The first discharging switching device TD1 of the nth stage is turned on or off in response to the scan pulse from the (n+1)th stage, and electrically interconnects the set node Q and any one of a plurality of clock transfer lines, which transfer the clock pulses, respectively, when turned on.

The first switching device Tr1 of the nth stage is turned on or off in response to the scan pulse from the (n−1)th stage, and electrically interconnects the output terminal OT of the (n−1)th stage and the set node Q when turned on.

The second switching device Tr2 of the nth stage is turned on or off in response to a voltage supplied to a common node CN, and electrically interconnects the set node Q and the output terminal OT of the nth stage when turned on.

The third switching device Tr3 of the nth stage is turned on or off in response to the voltage supplied to the set node Q, and electrically interconnects the common node CN and a discharging voltage line when turned on.

The capacitor C of the nth stage is connected between the clock transfer line and the common node CN.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on. Here, the reset node QB is connected to another one of the clock transfer lines. That is, this clock transfer line becomes the reset node QB.

A clock pulse CLKn supplied to the pull-up switching device Uc of the nth stage and a clock pulse CLKn+1 supplied to the pull-down switching device Ds of the nth stage do not overlap with each other, but have a phase difference of one clock pulse width therebetween. For example, provided that the first clock pulse CLK1 of FIG. 16 is supplied to the pull-up switching device Uc of the nth stage, the second clock pulse CLK2 of FIG. 16 may be supplied to the pull-down switching device Ds of the nth stage.

The clock pulse CLKn+1 supplied to the pull-down switching device Ds of the nth stage is the same as a clock pulse CLKn supplied to a pull-up switching device Uc of the (n+1)th stage.

Here, the first discharging switching device TD1, capacitor C and pull-up switching device Uc are all connected to the same clock transfer line.

The charging voltage VDD and the discharging voltage VSS are the same as those in the first embodiment.

According to the ninth embodiment, when the reset node QB connected to the gate terminal of the pull-down switching device Ds is low and the set node Q connected to the gate terminal of the pull-up switching device Uc is high, the clock pulse supplied to the drain terminal of the pull-up switching device Uc is output as the scan pulse. On the other hand, when the reset node QB becomes high and the set node Q becomes low, a gate line (output terminal OT) is kept low even if the clock pulse supplied to the drain terminal of the pull-up switching device Uc becomes high. That is, even though the clock pulse supplied to the drain terminal of the pull-up switching device Uc becomes high again, the set node Q is kept low when the output is not needed, so that the pull-up switching device Uc is not operated and, thus, the output is not generated.

At this time, noise may be generated at the set node Q due to a coupling voltage by the capacitor C, which is a parasitic capacitor of the pull-up switching device Uc. However, while the voltage of the clock pulse supplied to the pull-up switching device Uc changes to high, the voltage at the common node CN rises, too, so as to turn on the second switching device Tr2. As a result, the voltage at the set node Q is kept low by the turned-on second switching device Tr2, so that the set node Q is kept stable.

On the other hand, the level of a voltage applied to the gate terminal of the second switching device Tr2 is determined depending on capacitance of the capacitor C. Here, the capacitance of the capacitor C may be similar to or, preferably, greater than Cox (capacitance of a gate oxide film) of the second switching device Tr2.

While the scan pulse is output by the clock pulse in the state in which the set node Q is high, the second switching device Tr2 is kept turned off, thus preventing leakage of current from the set node Q.

Shift Register According to Tenth Embodiment

Figure 18:
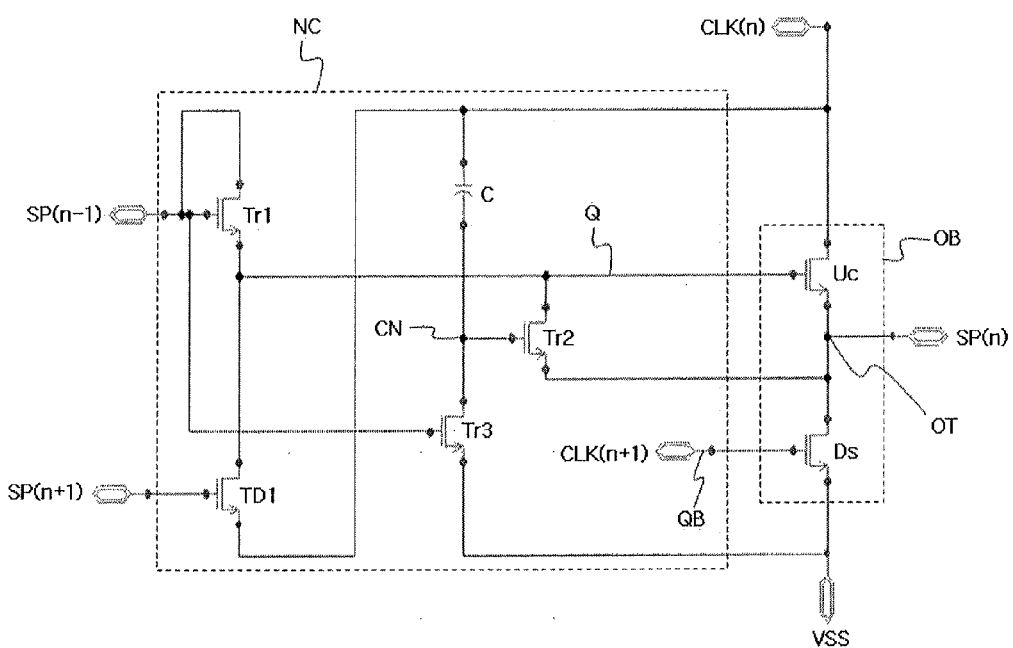
FIG. 18 is a circuit diagram of a stage according to a tenth embodiment of the present invention.

FIG. 18 is a circuit diagram of a stage according to a tenth embodiment of the present invention.

Each stage according to the tenth embodiment of the present invention includes a node controller NC and an output unit OB, as shown in FIG. 18. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to third switching devices Tr1 to Tr3, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects the output terminal OT of the (n−1)th stage and the set node Q when turned on.

The second switching device Tr2 of the nth stage is turned on or off in response to a voltage supplied to a common node CN, and electrically interconnects the set node Q and the output terminal OT of the nth stage when turned on.

The third switching device Tr3 of the nth stage is turned on or off in response to the scan pulse from the (n−1)th stage, and electrically interconnects the common node CN and a discharging voltage line when turned on.

The capacitor C of the nth stage is connected between the clock transfer line and the common node CN.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on. Here, the reset node QB is connected to another one of the clock transfer lines. That is, this clock transfer line becomes the reset node QB.

A clock pulse supplied to the pull-up switching device Uc of the nth stage and a clock pulse supplied to the pull-down switching device Ds of the nth stage do not overlap with each other, but have a phase difference of one clock pulse width therebetween. For example, provided that the first clock pulse CLK1 of FIG. 16 is supplied to the pull-up switching device Uc of the nth stage, the second clock pulse CLK2 of FIG. 16 may be supplied to the pull-down switching device Ds of the nth stage.

The clock pulse supplied to the pull-down switching device Ds of the nth stage is the same as a clock pulse supplied to a pull-up switching device Uc of the (n+1)th stage.

Here, the first discharging switching device TD1, capacitor C and pull-up switching device Uc are all connected to the same clock transfer line.

The charging voltage VDD and the discharging voltage VSS are the same as those in the first embodiment.

According to the tenth embodiment, while the scan pulse is output by a clock pulse in a state in which the set node Q is high, the second switching device Tr2 is kept turned off, thereby preventing the voltage at the set node Q from leaking. Also, although the voltage at the common node CN rises during the output of the scan pulse, the voltage at the set node Q and the voltage of the scan pulse are higher, thus suppressing leakage of current from the set node Q by the second switching device Tr2.

Shift Register According to Eleventh Embodiment

Figure 19:
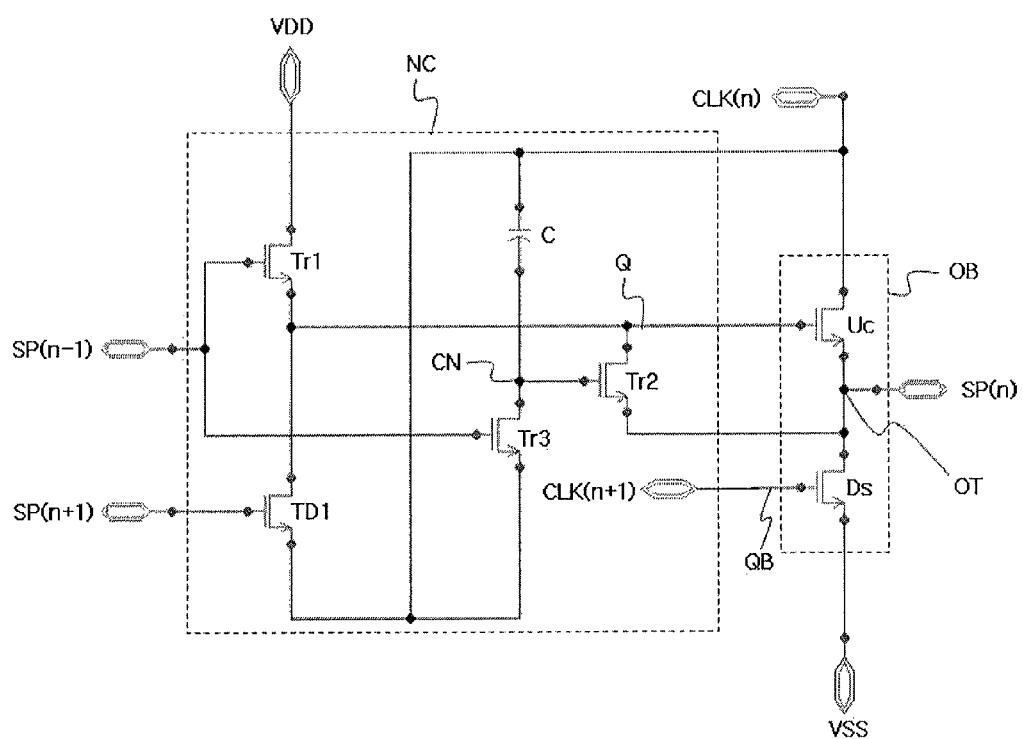
FIG. 19 is a circuit diagram of a stage according to an eleventh embodiment of the present invention.

FIG. 19 is a circuit diagram of a stage according to an eleventh embodiment of the present invention.

Each stage according to the eleventh embodiment of the present invention includes a node controller NC and an output unit OB, as shown in FIG. 19. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to third switching devices Tr1 to Tr3, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a common node CN, and electrically interconnects the set node Q and the output terminal OT of the nth stage when turned on.

The third switching device Tr3 of the nth stage is turned on or off in response to the scan pulse from the (n−1)th stage, and electrically interconnects the common node CN and the clock transfer line when turned on.

The capacitor C of the nth stage is connected between the clock transfer line and the common node CN.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and a discharging voltage line when turned on. Here, the reset node QB is connected to another one of the clock transfer lines. That is, this clock transfer line becomes the reset node QB.

A clock pulse supplied to the pull-up switching device Uc of the nth stage and a clock pulse supplied to the pull-down switching device Ds of the nth stage do not overlap with each other, but have a phase difference of one clock pulse width therebetween. For example, provided that the first clock pulse CLK1 of FIG. 16 is supplied to the pull-up switching device Uc of the nth stage, the second clock pulse CLK2 of FIG. 16 may be supplied to the pull-down switching device Ds of the nth stage.

The clock pulse supplied to the pull-down switching device Ds of the nth stage is the same as a clock pulse supplied to a pull-up switching device Uc of the (n+1)th stage.

Here, the first discharging switching device TD1, third switching device Tr3, capacitor C and pull-up switching device Uc are all connected to the same clock transfer line.

The charging voltage VDD and the discharging voltage VSS are the same as those in the first embodiment.

On the other hand, the low voltage of each of the clock pulses supplied respectively to the clock transfer lines may be set to be higher than the discharging voltage VSS.

Figure 20:
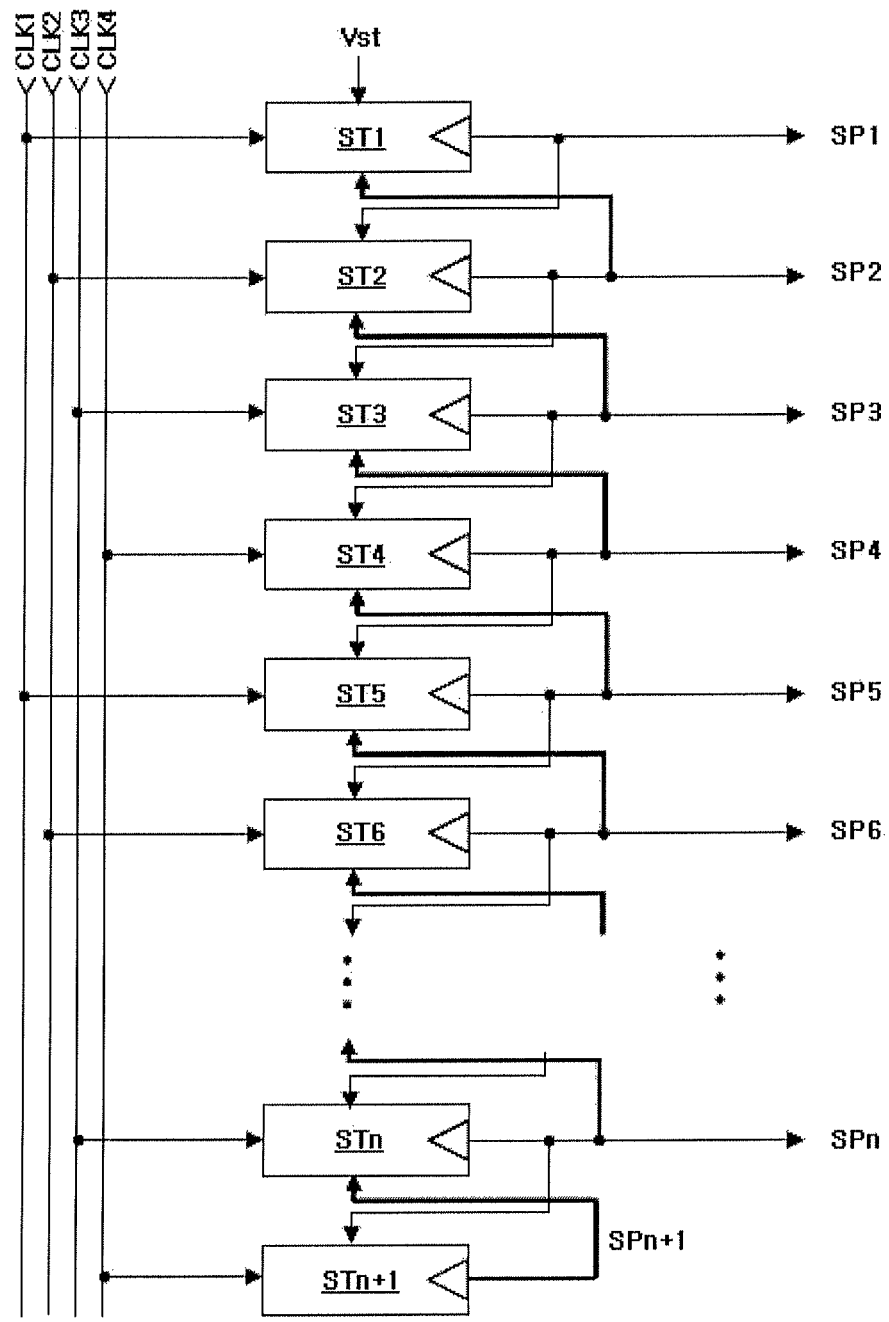
FIG. 20 is a block diagram showing the configuration of a shift register according to another embodiment of the present invention.

FIG. 20 is a block diagram showing the configuration of a shift register according to another embodiment of the present invention. Signals applied to the shift register shown in FIG. 20 and signals output therefrom are the same as those described above and shown in FIG. 16.

The shift register according to the present embodiment includes n stages ST1 to STn and one dummy stage STn+1, as shown in FIG. 20. Each of the stages ST1 to STn+1 outputs one scan pulse SP1 to SPn+1 for one frame period through an output terminal OT thereof.

Each of the stages ST1 to STn drives a gate line connected thereto using the scan pulse. Also, each of all the stages ST1 to STn+1 including the dummy stage controls the operations of a stage downstream therefrom and a stage upstream therefrom using the scan pulse.

The stages ST1 to STn+1 output the scan pulses in order from the first stage ST1 to the dummy stage STn+1. That is, the first stage ST1 outputs the first scan pulse SP1, the second stage ST2 then outputs the second scan pulse SP2, the third stage ST3 then outputs the third scan pulse SP3, . . . , the nth stage STn then outputs the nth scan pulse SPn, and the dummy stage STn+1 finally outputs the (n+1)th scan pulse SPn+1.

The scan pulses output from the stages ST1 to STn, other than the dummy stage STn+1, are sequentially supplied to gate lines of a liquid crystal panel (not shown) to sequentially scan the gate lines. Also, the scan pulse output from each of the stages is supplied only to an upstream stage, is supplied to the upstream stage and a downstream stage or is supplied only to the downstream stage.

This shift register may be built in the liquid crystal panel. That is, the liquid crystal panel has a display region for displaying an image, and a non-display region surrounding the display region, and the shift register is built in the non-display region.

Each of all the stages ST1 to STn+1 of the shift register, configured in this manner, is supplied with a charging voltage VDD, a discharging voltage VSS, and any one of first to fourth clock pulses CLK1 to CLK4 which are output sequentially out of phase with one another and cyclically. On the other hand, the first stage ST1 and dummy stage STn+1 among the stages ST1 to STn+1 are further supplied with a start pulse Vst.

The charging voltage VDD, discharging voltage VSS and first to fourth clock pulses CLK1 to CLK4 are the same as those stated previously, and a description thereof will thus be omitted. Exceptionally, the first to fourth clock pulses CLK1 to CLK4 shown in FIG. 16 do not overlap with one another. Of course, the start pulse Vst does not overlap with the clock pulses CLK1 to CLK4, either.

Although the four types of clock pulses having different phases are used for illustrative purposes in the present invention, any number of types of clock pulses may be used as long as they are two or more.

As shown in FIG. 20, a kth stage is enabled in response to a scan pulse from a (k−1)th stage. Here, k is a natural number. Exceptionally, the first stage ST1 is enabled in response to the start pulse Vst from a timing controller (not shown).

The kth stage is disabled in response to a scan pulse from a (k+1)th stage. Exceptionally, the dummy stage STn+1 is disabled in response to the start pulse Vst from the timing controller.

Hereinafter, a circuit configuration of each stage shown in FIG. 20 will be described in detail.

Shift Register According to Twelfth Embodiment

Figure 21:
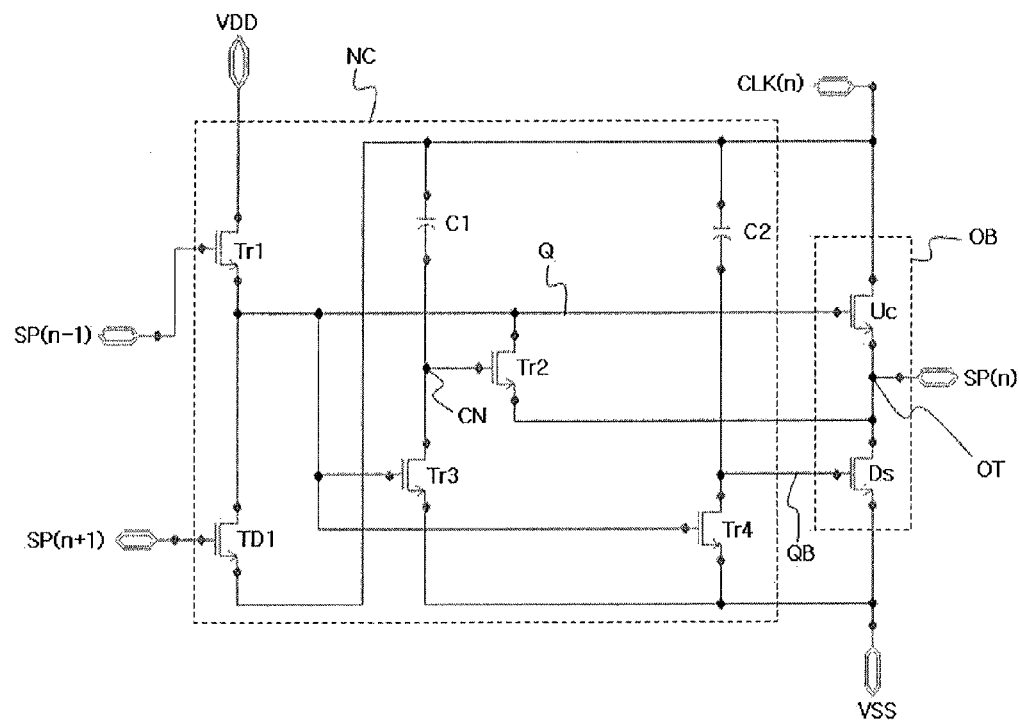
FIG. 21 is a circuit diagram of a stage according to a twelfth embodiment of the present invention.

FIG. 21 is a circuit diagram of a stage according to a twelfth embodiment of the present invention.

Each stage according to the twelfth embodiment of the present invention includes a node controller NC and an output unit OB, as shown in FIG. 21. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to fourth switching devices Tr1 to Tr4, a first capacitor C1, and a second capacitor C2.

The first discharging switching device TD1 of the nth stage is turned on or off in response to the scan pulse from the (n+1)th stage, and electrically interconnects the set node Q and any one of a plurality of clock transfer lines, which transfer the clock pulses, respectively, when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a common node CN, and electrically interconnects the set node Q and the output terminal OT of the nth stage when turned on.

The third switching device Tr3 of the nth stage is turned on or off in response to the voltage supplied to the set node Q, and electrically interconnects the common node CN and a discharging voltage line when turned on.

The fourth switching device Tr4 of the nth stage is turned on or off in response to the voltage supplied to the set node Q, and electrically interconnects the reset node QB and the discharging voltage line when turned on.

The first capacitor C1 of the nth stage is connected between the clock transfer line and the common node CN.

The second capacitor C2 of the nth stage is connected between the clock transfer line and the reset node QB.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on.

Here, the first discharging switching device TD1, first capacitor C1, second capacitor C2 and pull-up switching device Uc are all connected to the same clock transfer line.

The charging voltage VDD and the discharging voltage VSS are the same as those in the first embodiment.

According to the twelfth embodiment, in a period in which no scan pulse is output, the voltage at the reset node QB is kept high similarly to the voltage at the common node CN, thus suppressing a voltage variation at the output terminal OT. On the other hand, in a period in which the scan pulse is output, the second switching device Tr2 and the pull-down switching device Ds are kept turned off, thereby suppressing leakage of current from the set node Q.

Shift Register According to Thirteenth Embodiment

Figure 22:
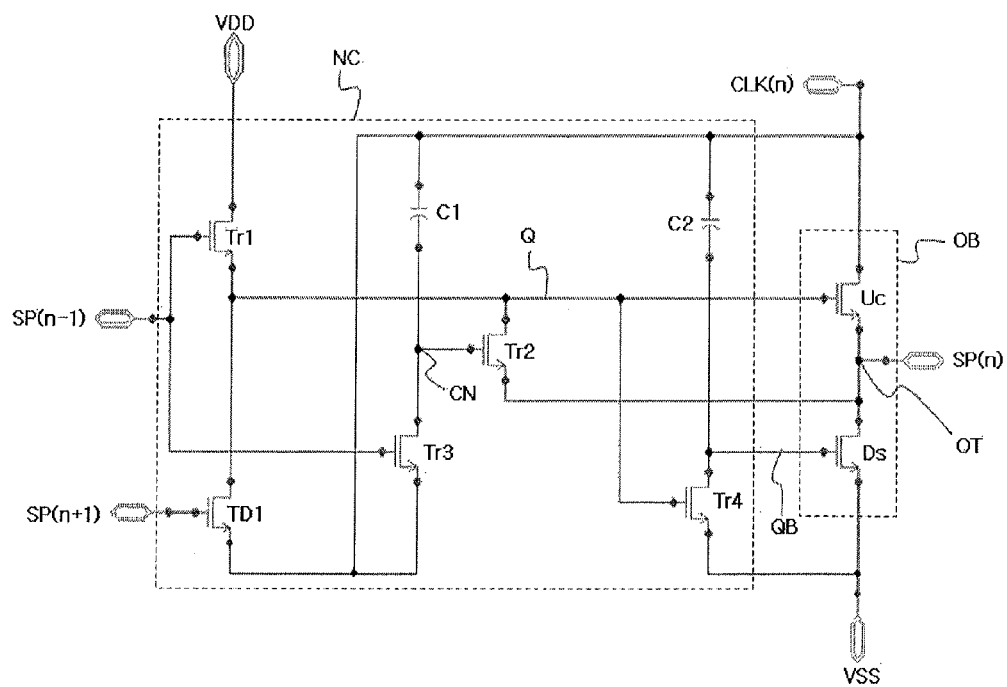
FIG. 22 is a circuit diagram of a stage according to a thirteenth embodiment of the present invention.

FIG. 22 is a circuit diagram of a stage according to a thirteenth embodiment of the present invention.

Each stage according to the thirteenth embodiment of the present invention includes a node controller NC and an output unit OB, as shown in FIG. 22. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to fourth switching devices Tr1 to Tr4, a first capacitor C1, and a second capacitor C2.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a common node CN, and electrically interconnects the set node Q and the output terminal OT of the nth stage when turned on.

The third switching device Tr3 of the nth stage is turned on or off in response to the scan pulse from the (n−1)th stage, and electrically interconnects the common node CN and the clock transfer line when turned on.

The fourth switching device Tr4 of the nth stage is turned on or off in response to the voltage supplied to the set node Q, and electrically interconnects the reset node QB and a discharging voltage line when turned on.

The first capacitor C1 of the nth stage is connected between the clock transfer line and the common node CN.

The second capacitor C2 of the nth stage is connected between the clock transfer line and the reset node QB.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on.

Here, the first discharging switching device TD1, third switching device Tr3, first capacitor C1, second capacitor C2 and pull-up switching device Uc are all connected to the same clock transfer line.

The charging voltage VDD and the discharging voltage VSS are the same as those in the first embodiment.

According to the thirteenth embodiment, in a period in which no scan pulse is output, the voltage at the reset node QB is kept high similarly to the voltage at the common node CN, thus suppressing a voltage variation at the output terminal OT. On the other hand, in a period in which the scan pulse is output, the second switching device Tr2 and the pull-down switching device Ds are kept turned off, thereby suppressing leakage of current from the set node Q. That is, in the period in which the scan pulse is output, the voltage at the reset node QB is kept low. In this period, although the voltage at the common node CN rises, the voltage at the set node Q and the voltage at the output terminal OT are higher, thus suppressing leakage of current by the second switching device Tr2.

Shift Register According to Fourteenth Embodiment

Figure 23:
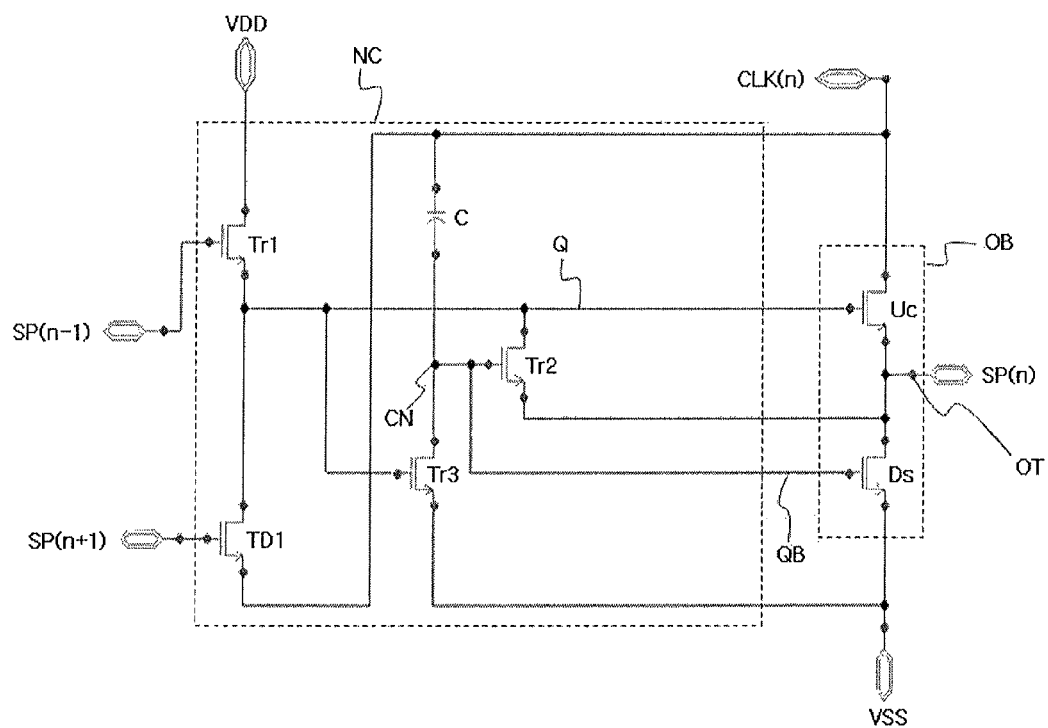
FIG. 23 is a circuit diagram of a stage according to a fourteenth embodiment of the present invention.

FIG. 23 is a circuit diagram of a stage according to a fourteenth embodiment of the present invention.

Each stage according to the fourteenth embodiment of the present invention includes a node controller NC and an output unit OB, as shown in FIG. 23. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to third switching devices Tr1 to Tr3, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a common node CN, and electrically interconnects the set node Q and the output terminal OT of the nth stage when turned on.

The third switching device Tr3 of the nth stage is turned on or off in response to the voltage supplied to the set node Q, and electrically interconnects the common node CN and a discharging voltage line when turned on.

The capacitor C of the nth stage is connected between the clock transfer line and the common node CN.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the common node CN, and electrically interconnects the output terminal OT of the nth stage and the discharging voltage line when turned on.

Here, the first discharging switching device TD1, capacitor C and pull-up switching device Uc are all connected to the same clock transfer line.

The charging voltage VDD and the discharging voltage VSS are the same as those in the first embodiment.

In a period in which no scan pulse is output, the voltage at the common node CN is kept high, thereby suppressing a voltage variation at the output terminal OT. On the other hand, in a period in which the scan pulse is output, the second switching device Tr2 and the pull-down switching device Ds are kept turned off, thereby suppressing leakage of current from the set node Q.

Shift Register According to Fifteenth Embodiment

Figure 24:
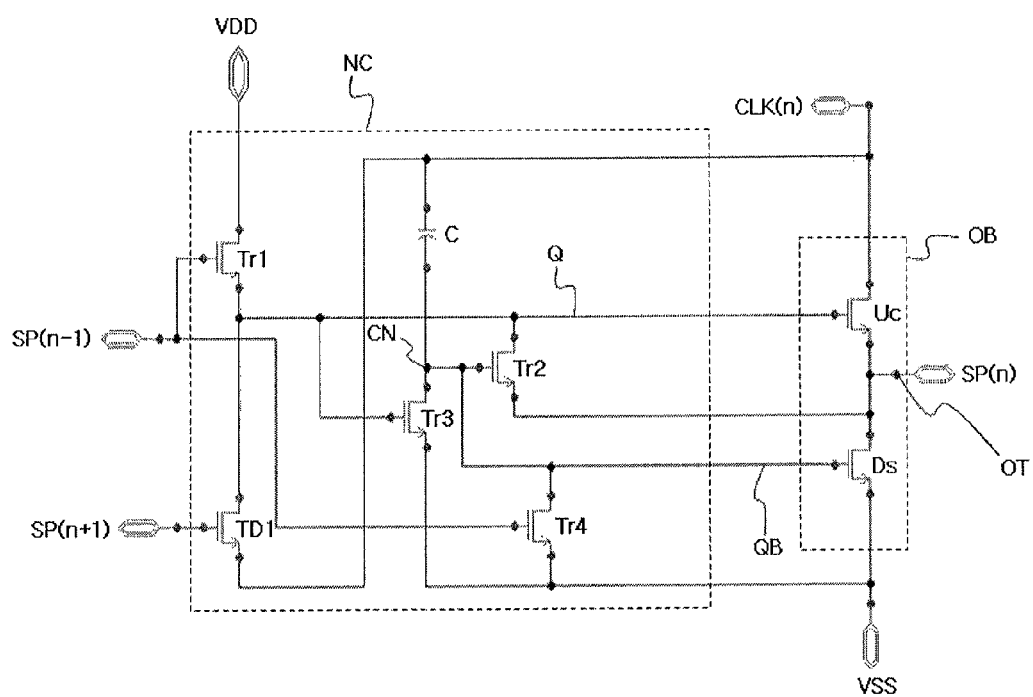
FIG. 24 is a circuit diagram of a stage according to a fifteenth embodiment of the present invention.

FIG. 24 is a circuit diagram of a stage according to a fifteenth embodiment of the present invention.

Each stage according to the fifteenth embodiment of the present invention includes a node controller NC and an output unit OB, as shown in FIG. 24. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to fourth switching devices Tr1 to Tr4, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a common node CN, and electrically interconnects the set node Q and the output terminal OT of the nth stage when turned on.

The third switching device Tr3 of the nth stage is turned on or off in response to the voltage supplied to the set node Q, and electrically interconnects the common node CN and a discharging voltage line when turned on.

The fourth switching device Tr4 of the nth stage is turned on or off in response to the scan pulse from the (n−1)th stage, and electrically interconnects the common node CN and the discharging voltage line when turned on.

The capacitor C of the nth stage is connected between the clock transfer line and the common node CN.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the common node CN, and electrically interconnects the output terminal OT of the nth stage and the discharging voltage line when turned on.

Here, the first discharging switching device TD1, capacitor C and pull-up switching device Uc are all connected to the same clock transfer line.

The charging voltage VDD and the discharging voltage VSS are the same as those in the first embodiment.

In a period in which no scan pulse is output, the voltage at the common node CN is kept high, thereby suppressing a voltage variation at the output terminal OT. On the other hand, in a period in which the scan pulse is output, the second switching device Tr2 and the pull-down switching device Ds are kept turned off, thereby suppressing leakage of current from the set node Q.

Shift Register According to Sixteenth Embodiment

Figure 25:
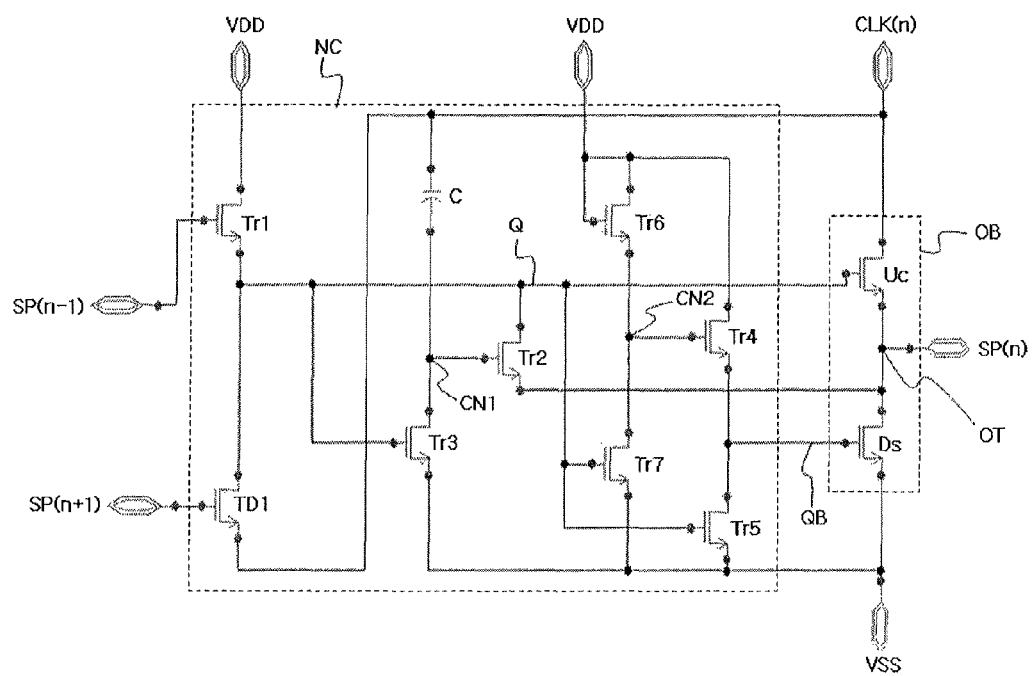
FIG. 25 is a circuit diagram of a stage according to a sixteenth embodiment of the present invention.

FIG. 25 is a circuit diagram of a stage according to a sixteenth embodiment of the present invention.

Each stage according to the sixteenth embodiment of the present invention includes a node controller NC and an output unit OB, as shown in FIG. 25. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to seventh switching devices Tr1 to Tr7, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a first common node CN1, and electrically interconnects the set node Q and the output terminal OT of the nth stage when turned on.

The third switching device Tr3 of the nth stage is turned on or off in response to the voltage supplied to the set node Q, and electrically interconnects the first common node CN1 and a discharging voltage line when turned on.

The fourth switching device Tr4 of the nth stage is turned on or off in response to a voltage supplied to a second common node CN2, and electrically interconnects the charging voltage line and the reset node QB when turned on.

The fifth switching device Tr5 of the nth stage is turned on or off in response to the voltage supplied to the set node Q, and electrically interconnects the reset node QB and the discharging voltage line when turned on.

The sixth switching device Tr6 of the nth stage is turned on or off in response to the charging voltage VDD from the charging voltage line, and electrically interconnects the charging voltage line and the second common node CN2 when turned on.

The seventh switching device Tr7 of the nth stage is turned on or off in response to the voltage supplied to the set node Q, and electrically interconnects the second common node CN2 and the discharging voltage line when turned on.

The capacitor C of the nth stage is connected between the clock transfer line and the first common node CN1.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on.

Here, the first discharging switching device TD1, capacitor C and pull-up switching device Uc are all connected to the same clock transfer line.

The charging voltage VDD and the discharging voltage VSS are the same as those in the first embodiment.

In a period in which no scan pulse is output, the voltages at the first common node CN1 and reset node QB are kept high, thereby suppressing voltage variations at the set node Q and output terminal OT. On the other hand, in a period in which the scan pulse is output, the second switching device Tr2 and the pull-down switching device Ds are kept turned off, thereby suppressing leakage of current from the set node Q.

Shift Register According to Seventeenth Embodiment

Figure 26:
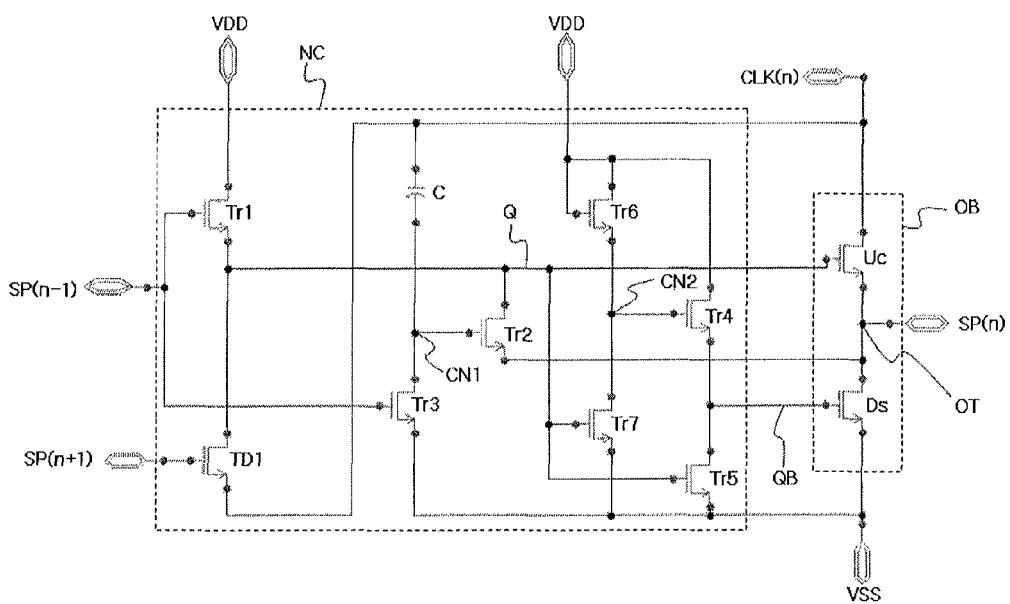
FIG. 26 is a circuit diagram of a stage according to a seventeenth embodiment of the present invention.

FIG. 26 is a circuit diagram of a stage according to a seventeenth embodiment of the present invention.

Each stage according to the seventeenth embodiment of the present invention includes a node controller NC and an output unit OB, as shown in FIG. 26. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to seventh switching devices Tr1 to Tr7, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a first common node CN1, and electrically interconnects the set node Q and the output terminal OT of the nth stage when turned on.

The third switching device Tr3 of the nth stage is turned on or off in response to the scan pulse from the (n−1)th stage, and electrically interconnects the first common node CN1 and a discharging voltage line when turned on.

The fourth switching device Tr4 of the nth stage is turned on or off in response to a voltage supplied to a second common node CN2, and electrically interconnects the charging voltage line and the reset node QB when turned on.

The fifth switching device Tr5 of the nth stage is turned on or off in response to the voltage supplied to the set node Q, and electrically interconnects the reset node QB and the discharging voltage line when turned on.

The sixth switching device Tr6 of the nth stage is turned on or off in response to the charging voltage VDD from the charging voltage line, and electrically interconnects the charging voltage line and the second common node CN2 when turned on.

The seventh switching device Tr7 of the nth stage is turned on or off in response to the voltage supplied to the set node Q, and electrically interconnects the second common node CN2 and the discharging voltage line when turned on.

The capacitor C of the nth stage is connected between the clock transfer line and the first common node CN1.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on.

Here, the first discharging switching device TD1, capacitor C and pull-up switching device Uc are all connected to the same clock transfer line.

The charging voltage VDD and the discharging voltage VSS are the same as those in the first embodiment.

In a period in which the scan pulse is output, although the voltage at the first common node CN1 rises, the voltages at the set node Q and output terminal OT are higher, thus suppressing leakage of current through the second switching device Tr2.

Shift Register According to Eighteenth Embodiment

Figure 27:
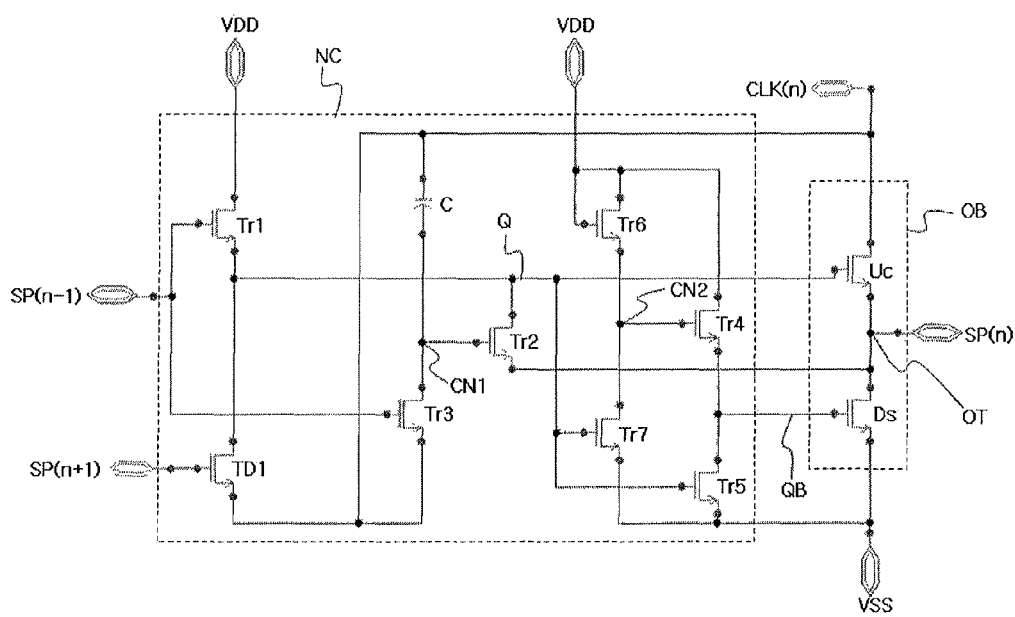
FIG. 27 is a circuit diagram of a stage according to an eighteenth embodiment of the present invention.

FIG. 27 is a circuit diagram of a stage according to an eighteenth embodiment of the present invention.

Each stage according to the eighteenth embodiment of the present invention includes a node controller NC and an output unit OB, as shown in FIG. 27. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to seventh switching devices Tr1 to Tr7, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a first common node CN1, and electrically interconnects the set node Q and the output terminal OT of the nth stage when turned on.

The third switching device Tr3 of the nth stage is turned on or off in response to the scan pulse from the (n−1)th stage, and electrically interconnects the first common node CN1 and the clock transfer line when turned on.

The fourth switching device Tr4 of the nth stage is turned on or off in response to a voltage supplied to a second common node CN2, and electrically interconnects the charging voltage line and the reset node QB when turned on.

The fifth switching device Tr5 of the nth stage is turned on or off in response to the voltage supplied to the set node Q, and electrically interconnects the reset node QB and the discharging voltage line when turned on.

The sixth switching device Tr6 of the nth stage is turned on or off in response to the charging voltage VDD from the charging voltage line, and electrically interconnects the charging voltage line and the second common node CN2 when turned on.

The seventh switching device Tr7 of the nth stage is turned on or off in response to the voltage supplied to the set node Q, and electrically interconnects the second common node CN2 and the discharging voltage line when turned on.

The capacitor C of the nth stage is connected between the clock transfer line and the first common node CN1.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on.

Here, the first discharging switching device TD1, third switching device Tr3, capacitor C and pull-up switching device Uc are all connected to the same clock transfer line.

The charging voltage VDD and the discharging voltage VSS are the same as those in the first embodiment.

In a period in which the scan pulse is output, although the voltage at the first common node CN1 rises, the voltages at the set node Q and output terminal OT are higher, thus suppressing leakage of current through the second switching device Tr2.

Shift Register According to Nineteenth Embodiment

Figure 28:
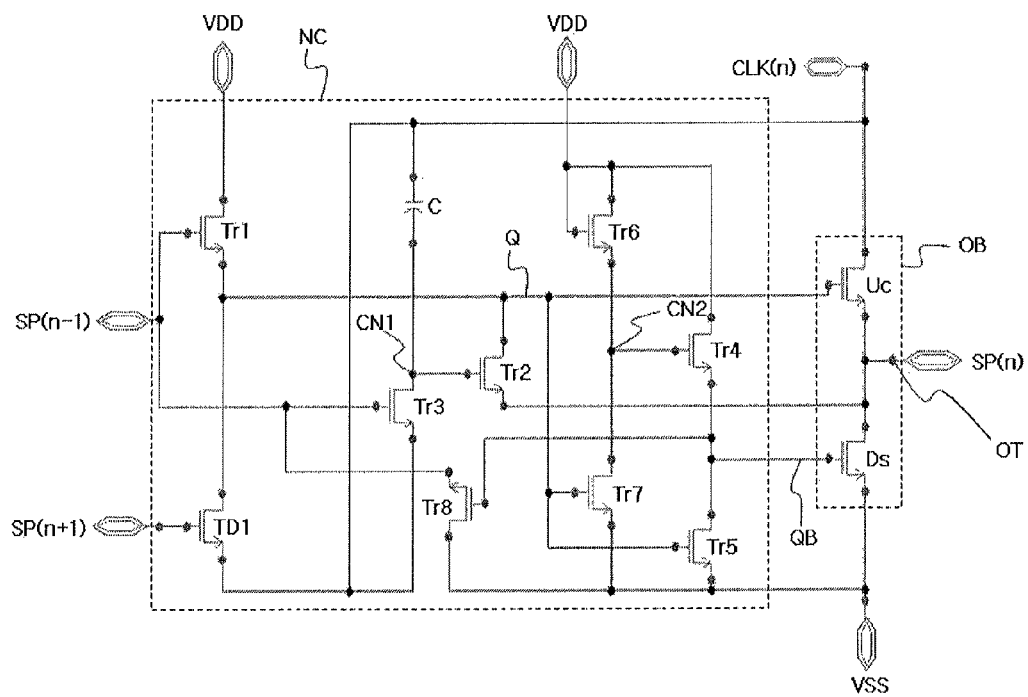
FIG. 28 is a circuit diagram of a stage according to a nineteenth embodiment of the present invention.

FIG. 28 is a circuit diagram of a stage according to a nineteenth embodiment of the present invention.

Each stage according to the nineteenth embodiment of the present invention includes a node controller NC and an output unit OB, as shown in FIG. 28. The node controller NC controls signal states of a set node Q and a reset node QB of a corresponding stage. The output unit OB is supplied with any one of a plurality of clock pulses having different phases, and outputs the supplied clock pulse as a scan pulse through an output terminal OT thereof in response to voltages supplied to the set node Q and reset node QB.

The node controller NC of the nth stage includes a first discharging switching device TD1, first to eighth switching devices Tr1 to Tr8, and a capacitor C.

The first discharging switching device TD1 of the nth stage is turned on or off in response to the scan pulse from the (n+1)th stage, and electrically interconnects the set node Q and any one of a plurality of clock transfer lines when turned on.

The first switching device Tr1 of the nth stage is turned on or off in response to the scan pulse from the (n−1)th stage, and electrically interconnects a charging voltage line and the set node Q when turned on.

The second switching device Tr2 of the nth stage is turned on or off in response to a voltage supplied to a first common node CN1, and electrically interconnects the set node Q and the output terminal OT of the nth stage when turned on.

The third switching device Tr3 of the nth stage is turned on or off in response to the scan pulse from the (n−1)th stage, and electrically interconnects the first common node CN1 and the clock transfer line when turned on.

The fourth switching device Tr4 of the nth stage is turned on or off in response to a voltage supplied to a second common node CN2, and electrically interconnects the charging voltage line and the reset node QB when turned on.

The fifth switching device Tr5 of the nth stage is turned on or off in response to the voltage supplied to the set node Q, and electrically interconnects the reset node QB and the discharging voltage line when turned on.

The sixth switching device Tr6 of the nth stage is turned on or off in response to the charging voltage VDD from the charging voltage line, and electrically interconnects the charging voltage line and the second common node CN2 when turned on.

The seventh switching device Tr7 of the nth stage is turned on or off in response to the voltage supplied to the set node Q, and electrically interconnects the second common node CN2 and the discharging voltage line when turned on.

The eighth switching device Tr8 of the nth stage is turned on or off in response to the voltage supplied to the reset node QB, and electrically interconnects the output terminal OT of the (n−1)th stage and the discharging voltage line when turned on.

The capacitor C of the nth stage is connected between the clock transfer line and the first common node CN1.

The output unit OB of the nth stage includes a pull-up switching device Uc and a pull-down switching device Ds.

The pull-up switching device Uc of the nth stage is turned on or off in response to the voltage supplied to the set node Q, and electrically interconnects the clock transfer line and the output terminal OT of the nth stage when turned on.

The pull-down switching device Ds of the nth stage is turned on or off in response to the voltage supplied to the reset node QB, and electrically interconnects the output terminal OT of the nth stage and the discharging voltage line when turned on.

Here, the first discharging switching device TD1, third switching device Tr3, capacitor C and pull-up switching device Uc are all connected to the same clock transfer line.

The charging voltage VDD and the discharging voltage VSS are the same as those in the first embodiment.

In a period in which the scan pulse is output, although the voltage at the first common node CN1 rises, the voltages at the set node Q and output terminal OT are higher, thus suppressing leakage of current through the second switching device Tr2.

Figure 29:
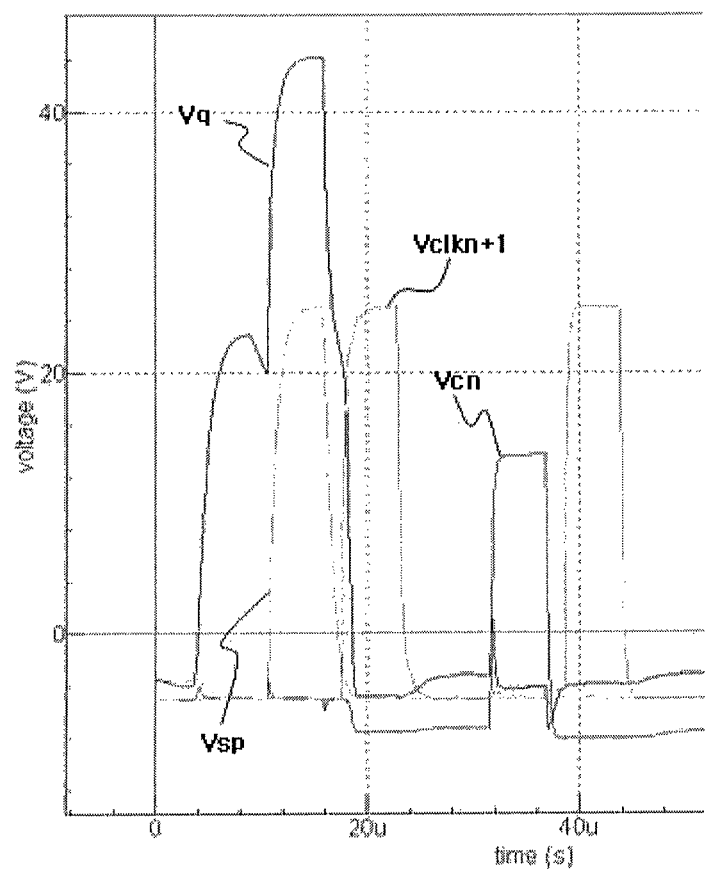
FIG. 29 is a waveform diagram of a voltage at a set node, a voltage of a scan pulse, a voltage of a clock pulse and a voltage at a common node, generated by a shift register according to the ninth embodiment of the present invention.

FIG. 29 is a waveform diagram of the voltage at the set node, the voltage of the scan pulse, the voltage of the clock pulse and the voltage at the common node CN, generated by the shift register according to the ninth embodiment (FIG. 17) of the present invention.

When the clock pulse is high, noise may be generated at the set node Q due to coupling. However, as shown in FIG. 29, the voltage at the common node CN rises, too, so as to turn on the second switching device Tr2. As a result, the voltage at the set node Q is kept low by the turned-on second switching device Tr2, so that the set node Q is kept stable.

Figure 30:
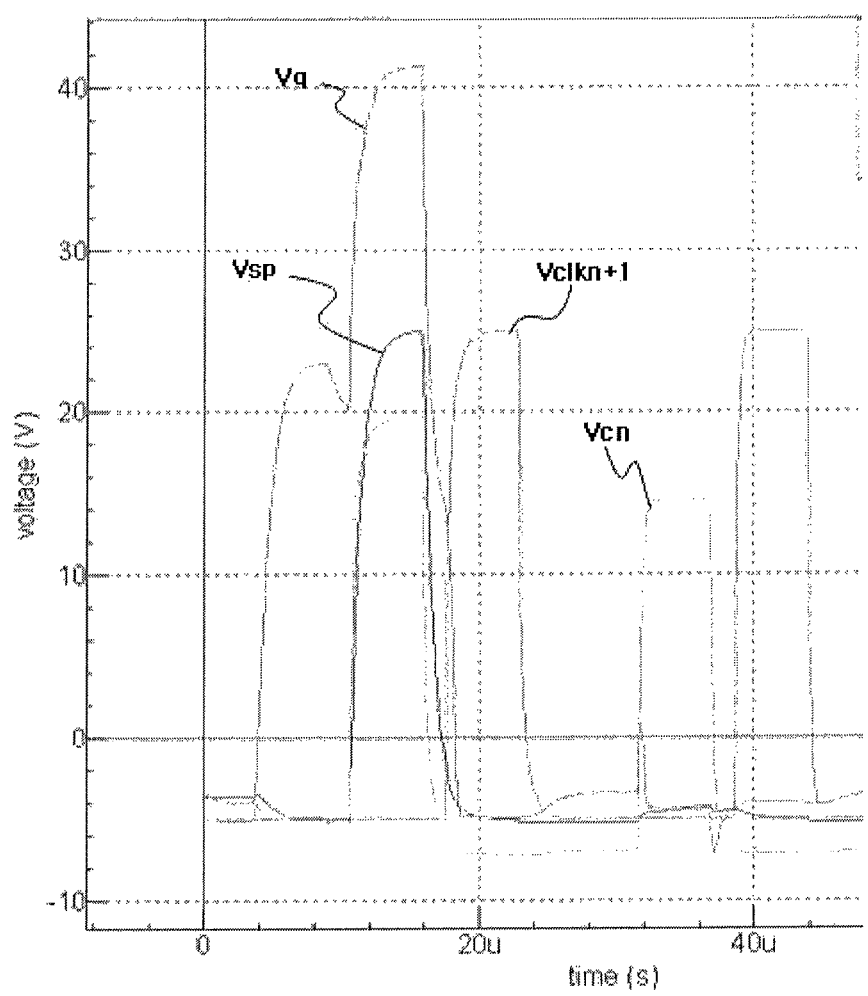
FIG. 30 is a waveform diagram of a voltage at a set node, a voltage of a scan pulse, a voltage of a clock pulse and a voltage at a common node, generated by a shift register according to the tenth embodiment of the present invention.

FIG. 30 is a waveform diagram of the voltage at the set node Q, the voltage of the scan pulse, the voltage of the clock pulse and the voltage at the common node CN, generated by the shift register according to the tenth embodiment (FIG. 18) of the present invention.

Figure 31:
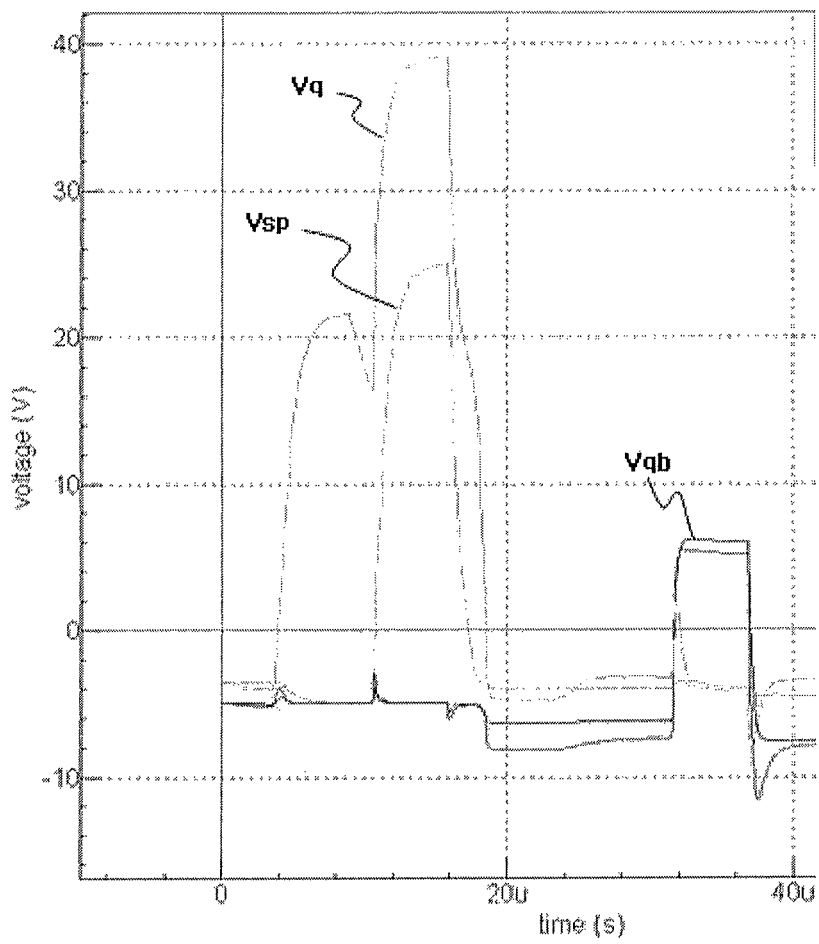
FIG. 31 is a waveform diagram of a voltage at a set node, a voltage of a scan pulse and a voltage at a reset node, generated by a shift register according to the twelfth embodiment of the present invention.

FIG. 31 is a waveform diagram of the voltage at the set node Q, the voltage of the scan pulse and the voltage at the reset node QB, generated by the shift register according to the twelfth embodiment (FIG. 21) of the present invention.

Figure 32:
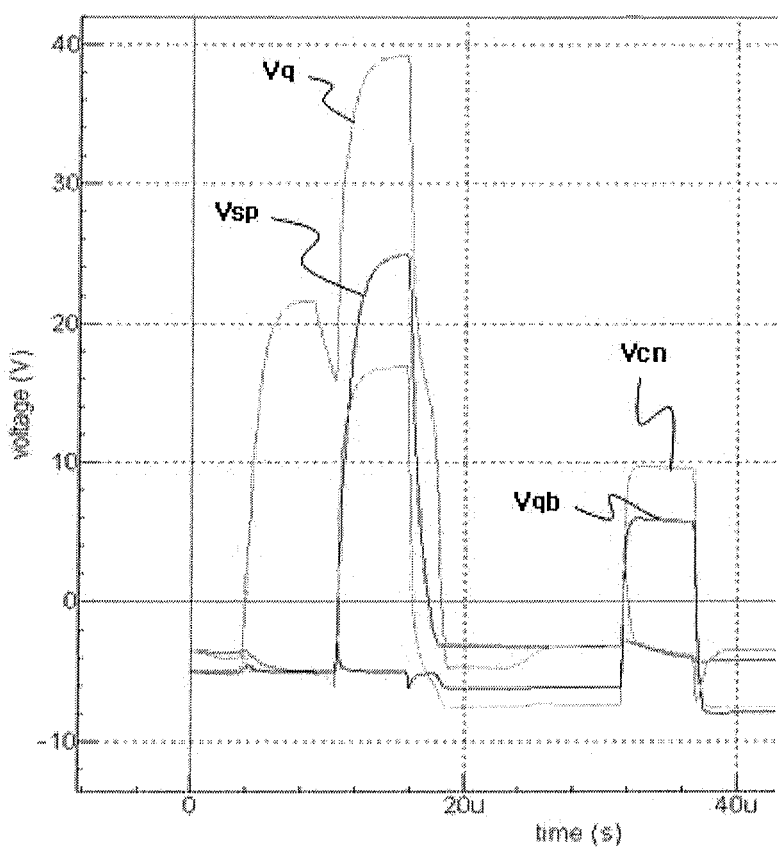
FIG. 32 is a waveform diagram of a voltage at a set node, a voltage of a scan pulse, a voltage at a common node and a voltage at a reset node, generated by a shift register according to the thirteenth embodiment of the present invention.

FIG. 32 is a waveform diagram of the voltage at the set node Q, the voltage of the scan pulse, the voltage at the common node CN and the voltage at the reset node QB, generated by the shift register according to the thirteenth embodiment (FIG. 22) of the present invention.

Figure 33:
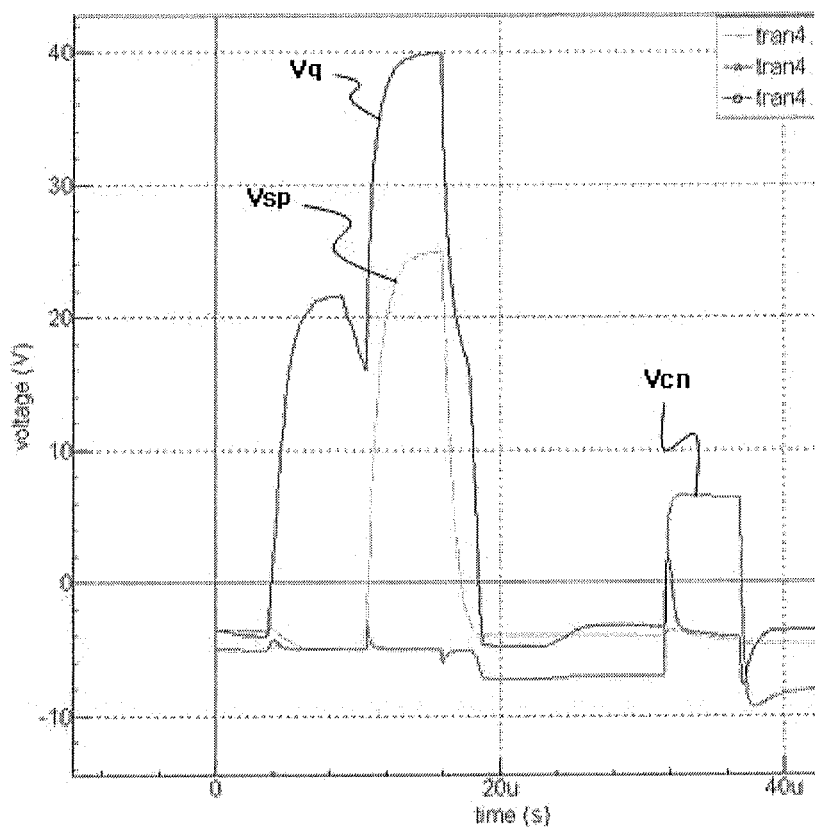
FIG. 33 is a waveform diagram of a voltage at a set node, a voltage of a scan pulse and a voltage at a common node, generated by a shift register according to the fourteenth embodiment of the present invention.

FIG. 33 is a waveform diagram of the voltage at the set node Q, the voltage of the scan pulse and the voltage at the common node CN, generated by the shift register according to the fourteenth embodiment (FIG. 23) of the present invention.

Figure 34:
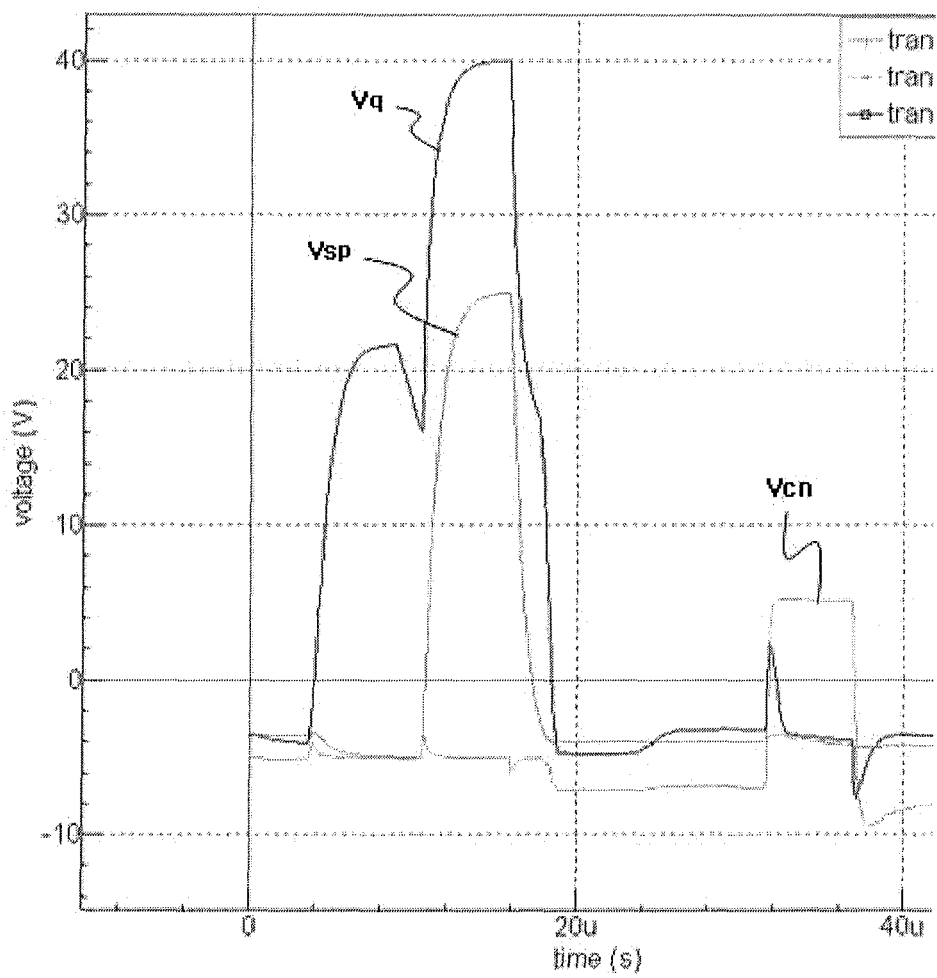
FIG. 34 is a waveform diagram of a voltage at a set node, a voltage of a scan pulse and a voltage at a common node, generated by a shift register according to the fifteenth embodiment of the present invention.

FIG. 34 is a waveform diagram of the voltage at the set node Q, the voltage of the scan pulse and the voltage at the common node CN, generated by the shift register according to the fifteenth embodiment (FIG. 24) of the present invention.

Figure 35:
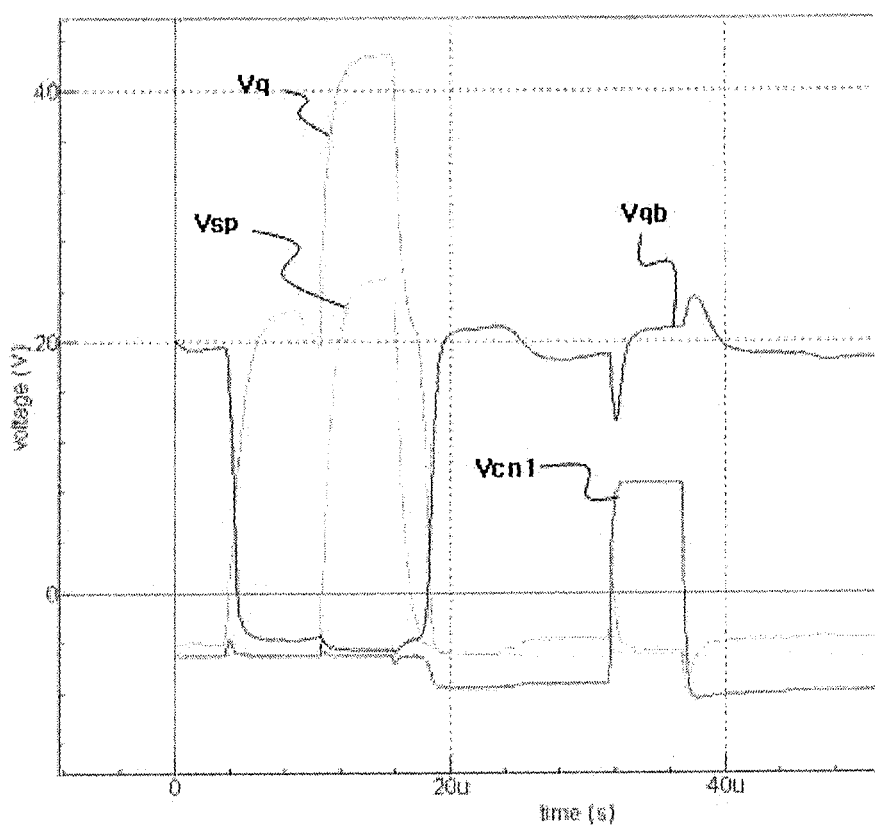
FIG. 35 is a waveform diagram of a voltage at a set node, a voltage of a scan pulse, a voltage at a reset node and a voltage at a first common node, generated by a shift register according to the sixteenth embodiment of the present invention.

FIG. 35 is a waveform diagram of the voltage at the set node Q, the voltage of the scan pulse, the voltage at the reset node QB and the voltage at the first common node CN1, generated by the shift register according to the sixteenth embodiment (FIG. 25) of the present invention.

Figure 36:
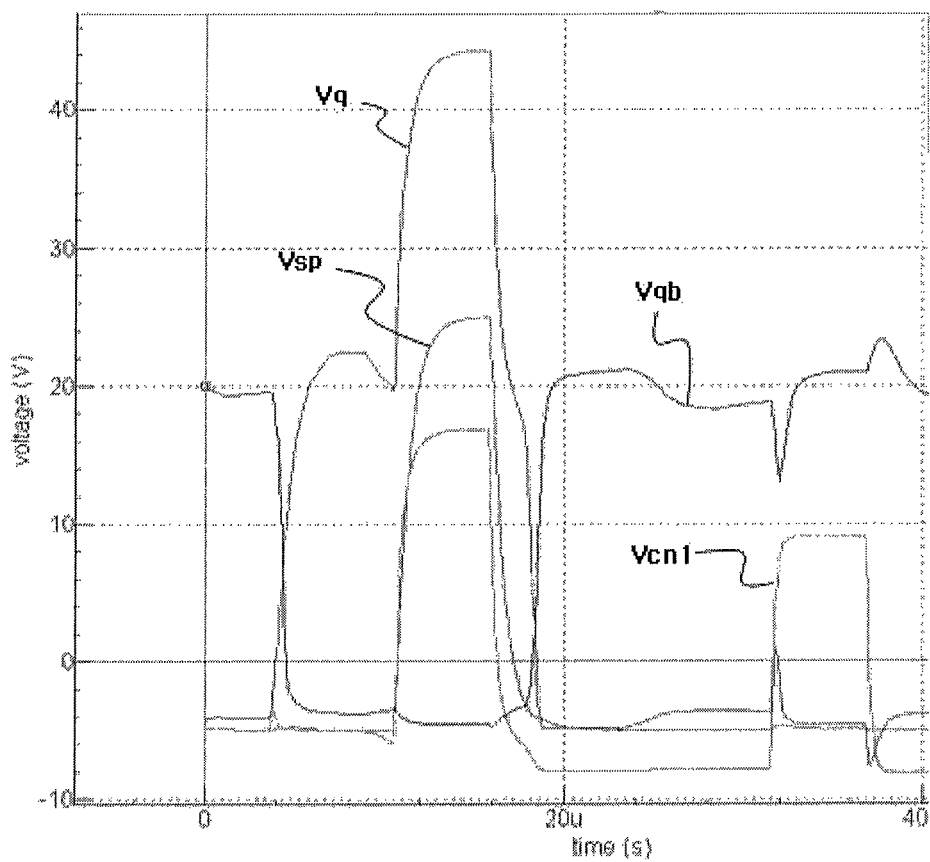
FIG. 36 is a waveform diagram of a voltage at a set node, a voltage of a scan pulse, a voltage at a reset node and a voltage at a first common node, generated by a shift register according to the seventeenth embodiment of the present invention.

FIG. 36 is a waveform diagram of the voltage at the set node Q, the voltage of the scan pulse, the voltage at the reset node QB and the voltage at the first common node CN1, generated by the shift register according to the seventeenth embodiment (FIG. 26) of the present invention.

Figure 37:
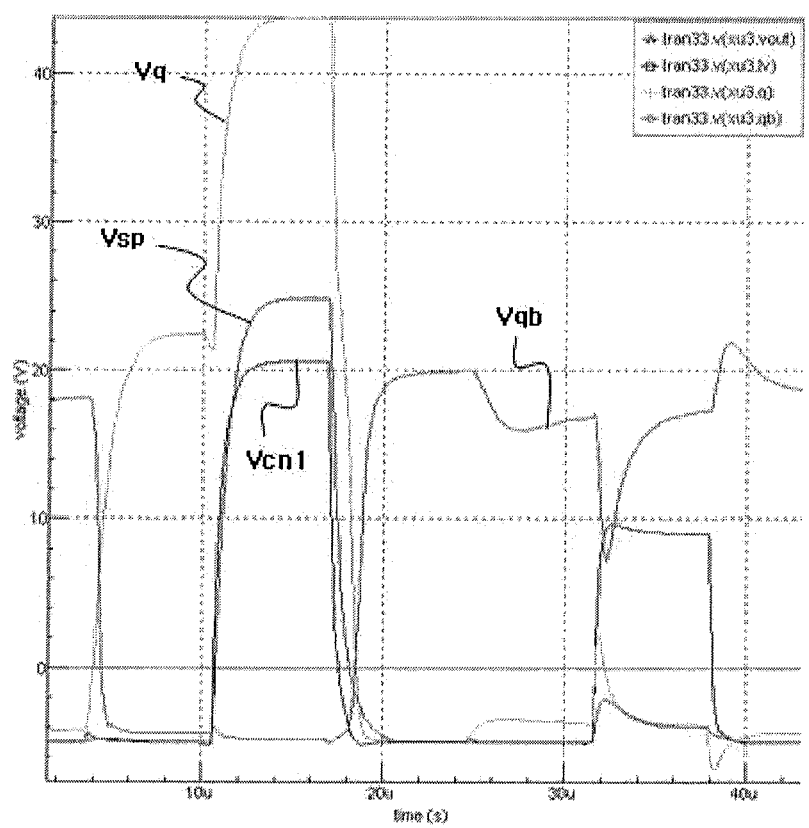
FIG. 37 is a waveform diagram of a voltage at a set node, a voltage of a scan pulse, a voltage at a reset node and a voltage at a first common node, generated by a shift register according to the eighteenth embodiment of the present invention.

FIG. 37 is a waveform diagram of the voltage at the set node Q, the voltage of the scan pulse, the voltage at the reset node QB and the voltage at the first common node CN1, generated by the shift register according to the eighteenth embodiment (FIG. 27) of the present invention.

Figure 38:
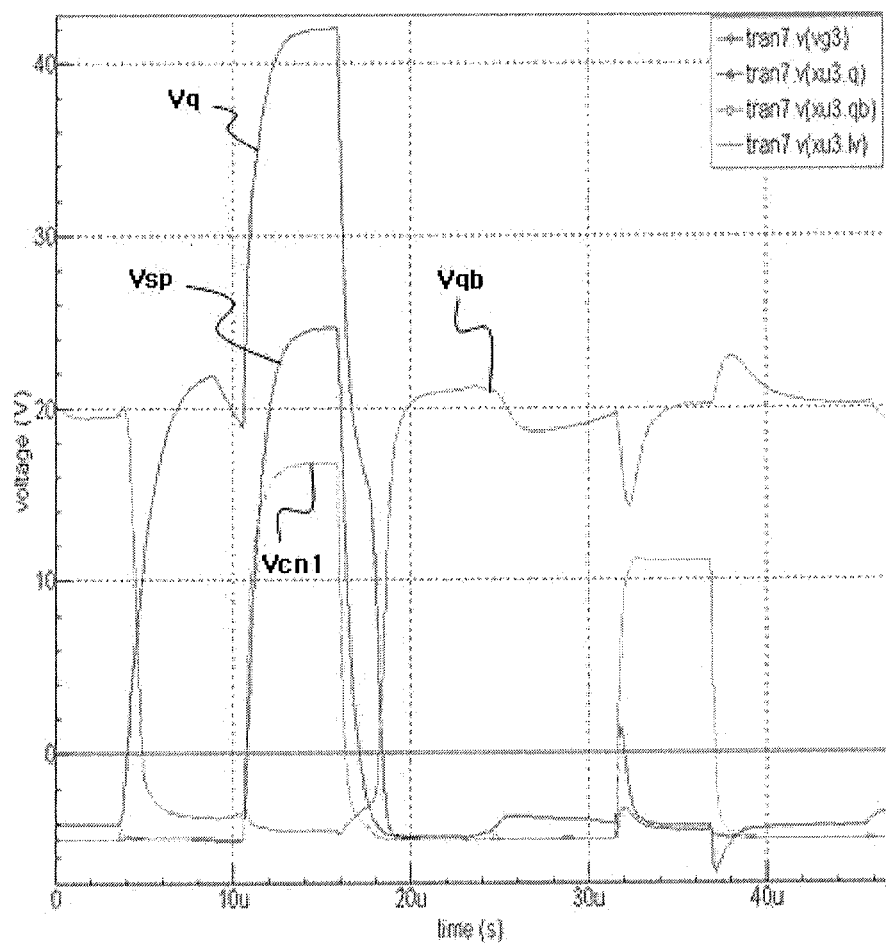
FIG. 38 is a waveform diagram of a voltage at a set node, a voltage of a scan pulse, a voltage at a reset node and a voltage at a first common node, generated by a shift register according to the nineteenth embodiment of the present invention.

FIG. 38 is a waveform diagram of the voltage at the set node Q, the voltage of the scan pulse, the voltage at the reset node QB and the voltage at the first common node CN1, generated by the shift register according to the nineteenth embodiment (FIG. 28) of the present invention.

On the other hand, the configuration of the first switching device Tr1 in all the embodiments may be modified such that the first switching device Tr1 is turned on or off in response to the scan pulse from the (n−1)th stage (or (n−2)th stage), and electrically interconnects the charging voltage line and the set node Q when turned on. In other words, the drain terminal of the first switching device Tr1 may be connected to the charging voltage line instead of the output terminal OT of the (n−1)th stage.

Further, the configuration of each stage in the ninth to nineteenth embodiments may be modified such that each stage is supplied with the scan pulse from the (n−2)th stage instead of the (n−1)th stage and the scan pulse from the (n+2)th stage instead of the (n+1)th stage. In this case, each stage in the ninth to nineteenth embodiments may be supplied with overlapping clock pulses CLK1 to CLK4 and start pulses Vst1 and Vst2 as in FIG. 4, and thus output overlapping scan pulses. Here, provided that the clock pulse supplied to the pull-up switching device Uc in the ninth to eleventh embodiments is the first clock pulse CLK1, the clock pulse supplied to the pull-down switching device Ds in the ninth to eleventh embodiments may be the third clock pulse CLK3.

As apparent from the above description, in a shift register of the present invention, a clock pulse having a voltage higher than a discharging voltage is supplied to the source electrode of a switching device which is in charge of discharging of a set node, instead of the discharging voltage, to completely turn off the switching device in an output period in which the clock pulse is output as a scan pulse, so as to normally generate the scan pulse.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A shift register comprising a plurality of stages for sequentially outputting scan pulses, wherein each of the stages comprises:

a node controller that controls signal states of a set node and a reset node; and an output unit supplied with any one of a plurality of clock pulses having different phases, the output unit outputting the supplied clock pulse as a corresponding one of the scan pulses through an output terminal thereof according to the signal states of the set node and reset node, wherein the node controller of each stage comprises a first discharging switching device turned on or off in response to a scan pulse from a downstream one of the stages, the first discharging switching device being connected between any one of a plurality of clock transfer lines, the clock transfer lines transferring the clock pulses, respectively, and the set node;

wherein the reset node comprises a first reset node and a second reset node, wherein the node controller of an nth one of the stages further comprises:

a first switching device turned on or off in response to a scan pulse from an (n−2)th one of the stages, the first switching device electrically interconnecting the set node and a charging voltage line when turned on;

a second switching device turned on or off in response to a clock pulse supplied to the output unit of an (n−1)th one of the stages, the second switching device electrically interconnecting the output terminal of the (n−1)th stage and the set node when turned on;

a third switching device turned on or off in response to a voltage supplied to a first common node, the third switching device electrically interconnecting a first alternating current (AC) voltage line and the first reset node when turned on;

a fourth switching device turned on or off in response to a voltage supplied to the set node, the fourth switching device electrically interconnecting the first reset node and a first discharging voltage line when turned on;

a fifth switching device turned on or off in response to a first AC voltage from the first AC voltage line, the fifth switching device electrically interconnecting the first AC voltage line and the first common node when turned on;

a sixth switching device turned on or off in response to the voltage supplied to the set node, the sixth switching device electrically interconnecting the first common node and the first discharging voltage line when turned on.

2. The shift register according to claim 1, wherein the node controller of an nth one of the stages further comprises:

a seventh switching device turned on or off in response to the scan pulse from the (n−2)th stage, the seventh switching device electrically interconnecting the first reset node and the first discharging voltage line when turned on;

an eighth switching device turned on or off in response to a voltage supplied to a second common node, the eighth switching device electrically interconnecting a second AC voltage line and the second reset node when turned on;

a ninth switching device turned on or off in response to the voltage supplied to the set node, the ninth switching device electrically interconnecting the second reset node and the first discharging voltage line when turned on;

a tenth switching device turned on or off in response to a second AC voltage from the second AC voltage line, the tenth switching device electrically interconnecting the second AC voltage line and the second common node when turned on;

an eleventh switching device turned on or off in response to the voltage supplied to the set node, the eleventh switching device electrically interconnecting the second common node and the first discharging voltage line when turned on; and a twelfth switching device turned on or off in response to the scan pulse from the (n−2)th stage, the twelfth switching device electrically interconnecting the second reset node and the first discharging voltage line when turned on, wherein the first discharging switching device of the node controller of the nth stage is turned on or off in response to a scan pulse from an (n+2)th one of the stages, and electrically interconnects the set node and the clock transfer line when turned on, wherein the first discharging voltage line transfers a first discharging voltage, wherein the first discharging voltage is lower than a charging voltage from the charging voltage line, wherein the first AC voltage is 180° phase-inverted with respect to the second AC voltage.

3. The shift register according to claim 2, wherein the output unit of the nth stage comprises:

a pull-up switching device turned on or off in response to the voltage supplied to the set node, the pull-up switching device electrically interconnecting the clock transfer line and the output terminal of the nth stage when turned on;

a first pull-down switching device turned on or off in response to a voltage supplied to the first reset node, the first pull-down switching device electrically interconnecting the output terminal of the nth stage and a second discharging voltage line when turned on; and a second pull-down switching device turned on or off in response to a voltage supplied to the second reset node, the second pull-down switching device electrically interconnecting the output terminal of the nth stage and the second discharging voltage line when turned on, wherein the second discharging voltage line transfers a second discharging voltage, wherein the second discharging voltage is higher than or equal to the first discharging voltage.

* * * * *